(12) United States Patent
Gerhard et al.

(10) Patent No.: US 10,985,529 B2
(45) Date of Patent: Apr. 20, 2021

(54) SEMICONDUCTOR LASER DIODE

(71) Applicant: OSRAM Opto Semiconductors GmbH, Regensburg (DE)

(72) Inventors: Sven Gerhard, Alteglofsheim (DE); Christoph Eichler, Donaustauf (DE); Alfred Lell, Maxhütte-Haidhof (DE); Bernhard Stojetz, Wiesent (DE)

(73) Assignee: OSRAM OLED GmbH, Regensburg (DE)

( * ) Notice: Subject to any disclaimer, the term of this patent is extended or adjusted under 35 U.S.C. 154(b) by 222 days.

(21) Appl. No.: 16/318,084

(22) PCT Filed: Jul. 12, 2017

(86) PCT No.: PCT/EP2017/067575
§ 371 (c)(1),
(2) Date: Jan. 15, 2019

(87) PCT Pub. No.: WO2018/011279
PCT Pub. Date: Jan. 18, 2018

(65) Prior Publication Data
US 2020/0321749 A1 Oct. 8, 2020

(30) Foreign Application Priority Data
Jul. 15, 2016 (DE) ...................... 10 2016 113 071.0

(51) Int. Cl.
*H01S 5/10* (2021.01)
*H01S 5/22* (2006.01)

(52) U.S. Cl.
CPC .............. *H01S 5/1017* (2013.01); *H01S 5/22* (2013.01); *H01S 2301/166* (2013.01)

(58) Field of Classification Search
CPC ........ H01S 5/1017; H01S 5/22; H01S 5/1003; H01S 5/1014; H01S 5/2202; H01S 5/24; H01S 2301/166
See application file for complete search history.

(56) References Cited

U.S. PATENT DOCUMENTS

| | | | |
|---|---|---|---|
| 6,445,723 B1 | 9/2002 | Ziari et al. | |
| 9,722,394 B2 | 8/2017 | Lauer et al. | |

(Continued)

FOREIGN PATENT DOCUMENTS

| | | |
|---|---|---|
| CN | 102113187 A | 6/2011 |
| CN | 102255240 A | 11/2011 |

(Continued)

OTHER PUBLICATIONS

The First Office Action dated May 8, 2020, of counterpart Chinese Application No. 201780043871.3, along with an English translation.

(Continued)

*Primary Examiner* — Armando Rodriguez
(74) *Attorney, Agent, or Firm* — DLA Piper LLP (US)

(57) ABSTRACT

A semiconductor laser diode includes a semiconductor layer sequence with an active layer having a main extension plane and that generates light in an active region and emits light via a light outcoupling surface during operation, wherein the active region extends from a rear surface opposite the light outcoupling surface to the light outcoupling surface along a longitudinal direction, the semiconductor layer sequence includes a trench structure having at least one trench or a plurality of trenches on at least one side laterally next to the active region, and each trench of the trench structure extends in a longitudinal direction and projects from a top side of the semiconductor layer sequence in a vertical direction into the semiconductor layer sequence, and the trench structure varies in a lateral and/or vertical and/or longitudinal direc- (Continued)

tion with respect to properties of the at least one trench or the plurality of trenches.

20 Claims, 17 Drawing Sheets

(56) References Cited

U.S. PATENT DOCUMENTS

| | | |
|---|---|---|
| 2001/0010701 A1 | 8/2001 | Furushima |
| 2005/0152418 A1* | 7/2005 | Hwang .................. B82Y 20/00 |
| | | 372/43.01 |
| 2006/0007976 A1 | 1/2006 | Watanabe et al. |
| 2006/0011946 A1 | 1/2006 | Toda et al. |
| 2007/0004072 A1 | 1/2007 | Takese |
| 2008/0181276 A1 | 7/2008 | Kawanaka et al. |
| 2009/0290612 A1* | 11/2009 | Yamaguchi ........... H01S 5/2231 |
| | | 372/46.012 |
| 2010/0290493 A1 | 11/2010 | Kawanishi et al. |
| 2011/0122907 A1 | 5/2011 | Schmid et al. |
| 2011/0188530 A1 | 8/2011 | Lell et al. |
| 2013/0182734 A1 | 7/2013 | Hamaguchi et al. |
| 2013/0292723 A1 | 11/2013 | Ohno |
| 2014/0064311 A1 | 3/2014 | Eichler et al. |
| 2016/0043530 A1 | 2/2016 | Lell et al. |
| 2016/0315446 A1* | 10/2016 | Taeger .................. H01S 5/0224 |
| 2017/0330997 A1 | 11/2017 | Lell et al. |

FOREIGN PATENT DOCUMENTS

| | | |
|---|---|---|
| CN | 103208740 A | 7/2013 |
| CN | 103975490 A | 8/2014 |
| DE | 10 2008 012 859 A1 | 11/2009 |
| DE | 10 2011 100 175 A1 | 11/2012 |
| DE | 10 2012 110 613 A1 | 5/2014 |
| DE | 102013204192 A1 | 9/2014 |
| DE | 10 2014 117 510 A1 | 6/2016 |
| JP | 2005-116728 A | 4/2005 |
| JP | 2005-183821 A | 7/2005 |
| JP | 2010-123869 A | 6/2010 |
| JP | 2010-199139 A | 9/2010 |

OTHER PUBLICATIONS

Y-H. Liu et al., "Coupled ridge waveguide distributed feedback quantum cascade laser arrays", *Applied Physics Letters*, 2015, vol. 106, No. 14, pp. 142104-1-142104-4.

H. Taleb et al., "Optical Gain, Phase, and Refractive Index Dynamics in Photonic Crystal Quantum-Dot Semiconductor Optical Amplifiers", *IEEE Journal of Quantum Electronics*, vol. 50, No. 8, Aug. 2014, pp. 605-612.

F. Yao et al., "Analysis of gain and saturation charascteristics of a semiconductor laser amplifier of laterally tapered active layer", *Infrared and Laser Engineering*, vol. 27, No. 6, Dec. 1998, 4 pages, along with an English translation.

* cited by examiner

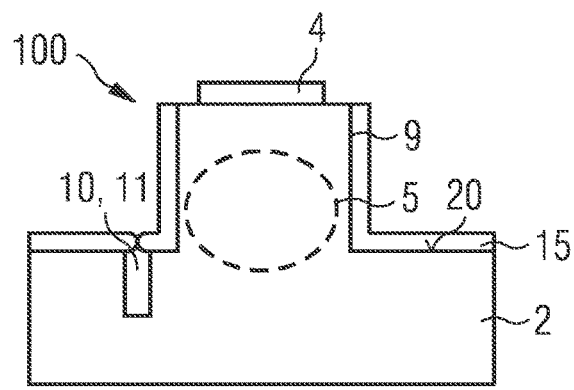
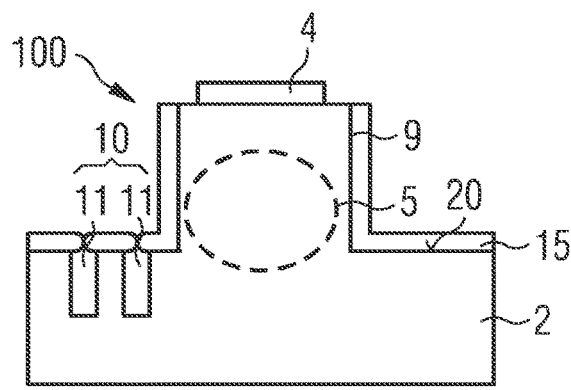
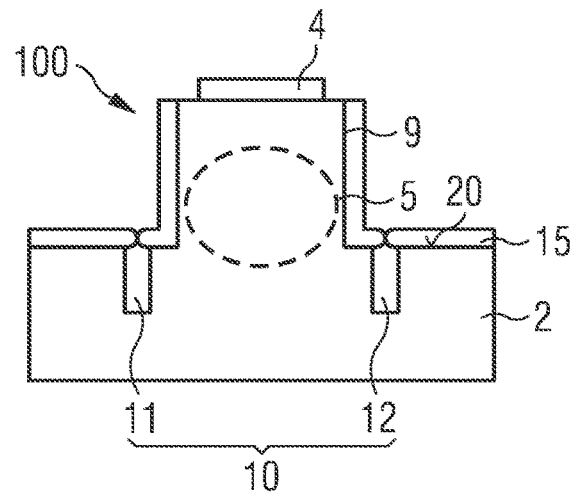
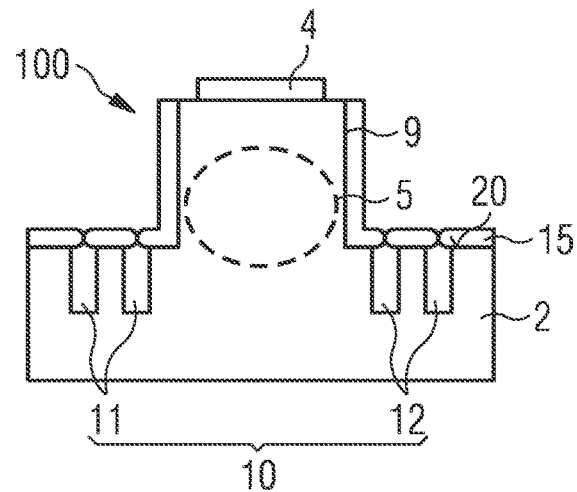

SEMICONDUCTOR LASER DIODE

TECHNICAL FIELD

This disclosure relates to a semiconductor laser diode.

BACKGROUND

Nowadays it is possible to cover a multitude of different applications having very different requirement profiles using semiconductor laser diodes. The requirements can lie, for example, in the optical output power, the facet load limit that can range from a few milliwatts to several watts, in the operating current that can range from a few milliamperes to hundreds of amperes, or in the far field that can be strictly monomodal or multimodal.

Often semiconductor laser diodes with ridge waveguide laser structures are used that have a semiconductor ridge with which a so-called index guidance of the laser mode can be achieved. The ridge side surfaces as well as the semiconductor surface next to the ridge are protected against external influences by passivation. The passivation also insulates the semiconductor surface against the metal of the bond pad applied for electrical contacting. The index guidance is achieved by the refractive index jump at the ridge side surfaces from the semiconductor material to the passivation material. The disadvantage is, however, that the refractive index of the passivation material can only be varied to a limited extent because the refractive index is determined by the properties of the passivation material. In particular, refractive indices of less than 1.5 are difficult to achieve. To achieve a strong guidance of the laser mode, depending on the application lower refractive indices are desirable. Also, a variation of the refractive index along the ridge is often desirable, but hardly feasible with conventional methods.

SUMMARY

We provide a semiconductor laser diode including a semiconductor layer sequence with an active layer having a main extension plane and that generates light in an active region and emits light via a light outcoupling surface during operation, wherein the active region extends from a rear surface opposite the light outcoupling surface to the light outcoupling surface along a longitudinal direction in the main extension plane, the semiconductor layer sequence includes a trench structure having at least one trench or a plurality of trenches on at least one side laterally next to the active region, and each trench of the trench structure extends in a longitudinal direction and projects from a top side of the semiconductor layer sequence in a vertical direction into the semiconductor layer sequence, and the trench structure varies in a lateral and/or vertical and/or longitudinal direction with respect to properties of the at least one trench or the plurality of trenches.

We also provide a semiconductor laser diode including a semiconductor layer sequence with an active layer having a main extension plane and that generates light in an active region and emits light via a light outcoupling surface during operation, wherein the active region extends from a rear surface opposite the light outcoupling surface to the light outcoupling surface along a longitudinal direction in the main extension plane, the semiconductor layer sequence includes a trench structure having at least one trench or a plurality of trenches on at least one side laterally next to the active region, and each trench of the trench structure extends in a longitudinal direction and projects from a top side of the semiconductor layer sequence in a vertical direction into the semiconductor layer sequence, the trench structure varies in a lateral and/or vertical and/or longitudinal direction with respect to properties of the at least one trench or the plurality of trenches, a refractive index jump is produced on the surfaces delimiting the at least one trench in the lateral direction by which an expansion and a course of a light mode resulting in the active region are set, and the trench structure includes at least two trenches on a side laterally next to the active region and/or the at least one trench is at least partially filled with a solid material including a porous material.

Figure 1A:
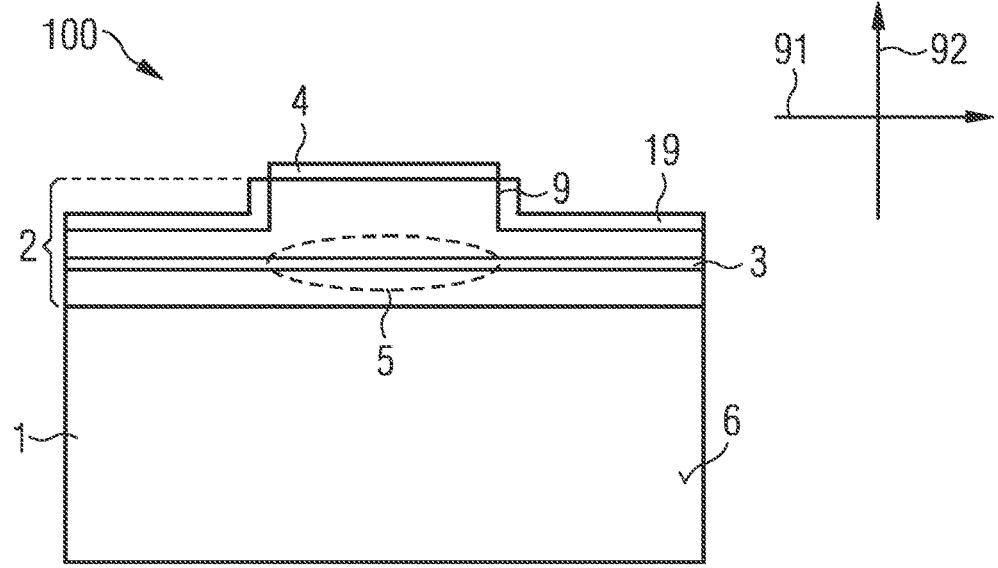
FIGS. 1A to 1C show schematic illustrations of examples of a semiconductor laser diode.

REFERENCE LIST 1 substrate
2 semiconductor layer sequence
3 active layer
4 electrode layer
5 active area
6 light outcoupling surface
7 rear surface
8 light
9 ridge waveguide structure
10 trench structure
11 trench
12 trench
13 material
14 layer
15 covering material
19 passivation material
20 top side
21, 22 semiconductor layer
23 opening
30 bond pad
40 mask
91 lateral direction
92 vertical direction
93 longitudinal direction
100 semiconductor laser diode

DETAILED DESCRIPTION

Our semiconductor laser diode has at least one active layer that generates light in an active region during operation. In particular, the active layer may be part of a semiconductor layer sequence comprising a plurality of semiconductor layers and may have a main extension plane perpendicular to an arrangement direction of the layers of the semiconductor layer sequence. Furthermore, the semiconductor laser diode has a trench structure with at least one trench or a plurality of trenches.

For example, the active layer can have exactly one active area. The active area can at least partly be defined by a contact surface of the semiconductor layer sequence with an electrode layer, i.e. at least partly by a surface over which a current is applied into the semiconductor layer sequence and thus the active layer. Furthermore, the active area can at least partially be defined by a ridge waveguide structure, i.e. a ridge formed in the shape of an elongated elevation in the semiconductor material of the semiconductor layer sequence. In addition, the active area can also be defined at least partially by the trench structure.

In our method of manufacturing a semiconductor laser diode, an active layer is produced that generates light during operation of the semiconductor laser diode. In particular, a semiconductor layer sequence with the active layer can be produced. The features described above and below apply equally to the semiconductor laser diode and to the method of manufacturing the semiconductor laser diode.

The semiconductor laser diode may have a light outcoupling surface and a rear surface opposite the light outcoupling surface. The light outcoupling surface and the rear surface can in particular be side surfaces of the semiconductor laser diode that can also be called facets. During operation, via the light coupler surface the semiconductor laser diode can emit the light generated in the active area. Suitable optical coatings, in particular reflective or partially reflective layers or layer sequences that can form an optical resonator for the light produced in the active layer, may be applied to the light outcoupling surface and the rear surface. The active area can extend between the rear surface and the light outcoupling surface along a direction referred to as the longitudinal direction. The longitudinal direction can in particular be parallel to the main extension plane of the active layer. The arrangement direction of the layers on top of each other, i.e. a direction perpendicular to the main extension plane of the active layer, is referred to as the vertical direction. A direction perpendicular to the longitudinal direction and perpendicular to the vertical direction is referred to as the lateral direction. The longitudinal direction and the lateral direction can thus span a plane parallel to the main extension plane of the active layer.

The semiconductor layer sequence can in particular be an epitaxial layer sequence, i.e. epitaxially grown semiconductor layer sequence. The semiconductor layer sequence can be based on InAlGaN, for example. InAlGaN-based semiconductor layer sequences include in particular those in which the epitaxially produced semiconductor layer sequence generally comprises a layer sequence of different individual layers containing at least one individual layer which comprises a material from the III-V compound semiconductor material system $In_xAl_yGa_{1-x-y}N$— with $0 \leq x \leq 1$, $0 \leq y \leq 1$ and $x+y \leq 1$. In particular, the active layer can be based on such a material. Semiconductor layer sequences that have at least one active layer based on InAlGaN can, for example, emit electromagnetic radiation in an ultraviolet to green wavelength range.

Alternatively or additionally, the semiconductor layer sequence can also be based on InAlGaP, which means that the semiconductor layer sequence can have different individual layers, of which at least one individual layer, e.g. the active layer comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences having at least one active layer based on InAlGaP can, for example, preferably emit electromagnetic radiation with one or more spectral components in a green to red wavelength range.

Alternatively or additionally, the semiconductor layer sequence may also include other III-V compound semiconductor material systems such as an InAlGaAs-based material or II-VI compound semiconductor material systems. In particular, an active layer of a light-emitting semiconductor chip comprising an InAlGaAs-based material may be suitable for emitting electromagnetic radiation having one or more spectral components in a red to infrared wavelength range.

A II-VI compound semiconductor material may have at least one element from the second main group such as Be, Mg, Ca, Sr, and one element from the sixth main group such as O, S, Se. For example, the II-VI compound semiconductor materials include ZnO, ZnMgO, CdS, ZnCdS and MgBeO.

The active layer and, in particular, the semiconductor layer sequence with the active layer can be deposited on a substrate. For example, the substrate can be a growth substrate on which the semiconductor layer sequence is grown. The active layer and, in particular, a semiconductor layer sequence with the active layer can be grown on the growth substrate by an epitaxial method, for example, by metal-organic vapor phase epitaxy (MOVPE) or molecular beam epitaxy (MBE), and provided with electrical contacts. Furthermore, it may also be possible that the growth substrate is removed after the growth process. Also, the semiconductor layer sequence can, for example, be transferred to a carrier substrate after growth. The substrate may comprise a semiconductor material such as a compound semiconductor material system mentioned above or another material. In particular, the substrate may comprise or be made of sapphire, GaAs, GaP, GaN, InP, SiC, Si, Ge and/or a ceramic material such as SiN or AlN.

The active layer may, for example, have a conventional pn-junction, a double heterostructure, a single quantum well structure (SQW structure), or a multiple quantum well structure (MQW structure) for light generation. In addition to the active layer, the semiconductor layer sequence can also comprise other functional layers and functional areas such as p- or n-doped charge carrier transport layers, i.e. electron or hole transport layers, undoped or p- or n-doped confinement, cladding or waveguide layers, barrier layers, planarization layers, buffer layers, protective layers and/or electrodes as well as combinations thereof. Additional layers such as buffer layers, barrier layers and/or protective layers can also be arranged perpendicular to the growth direction of the semiconductor layer sequence, for example, around the semiconductor layer sequence, i.e. on the side surfaces of the semiconductor layer sequence.

The semiconductor layer sequence may have a trench structure with one trench or a plurality of trenches on a top side. In particular, the top side can be a surface that delimits the semiconductor layer sequence in the vertical direction. If the semiconductor layer sequence is deposited on a substrate, the top side may be a surface of the semiconductor layer sequence opposite the substrate. The top side can be flat except for the trench structure or can also have an additional surface structure, for example, a ridge waveguide structure. To produce the trench structure, at least one trench or a plurality of trenches are produced in the top side of the semiconductor layer sequence. Each trench of the trench structure thus projects from the top side of the semiconductor layer sequence in a vertical direction into the semiconductor layer sequence.

In particular, the trench structure may have at least one trench or a plurality of trenches on at least one side laterally next to the active area. "Laterally next to the active region"

means in particular that the one or more trenches are not arranged centrally above the active region but offset in a lateral direction to a plane perpendicular to the lateral direction and, in particular, can be a plane of symmetry for the active region spanned in the vertical and the longitudinal direction. The trench structure may thus have at least one or a plurality of trenches that, when viewed vertically from the top side of the semiconductor layer sequence, are laterally offset from the center of the active region. It may also be that the trench structure comprises at least one or a plurality of trenches that, in a view onto the top side of the semiconductor layer sequence, at least partially overlap with a lateral extension of the active region. The trench structure particularly preferably comprises on one side lateral to the active area at least one trench and a number of less than or equal to 10 trenches.

The trench or trenches may extend in the longitudinal direction. A "longitudinally extending trench" means in particular that the trench has a principal direction of extension along the longitudinal direction. The trench extension is therefore larger in the longitudinal direction, preferably considerably larger, than in the lateral direction. The trench or trenches can be straight, preferably parallel to the longitudinal direction, or curved. For example, a longitudinally extending trench can extend from the rear surface to the light outcoupling surface. Alternatively, such a trench may also be spaced from the rear surface and/or from the light outcoupling surface, i.e. not reach as far as the rear surface and/or as far as the light outcoupling surface.

In particular, an etching process can be used to produce the trench structure. The trench or trenches can thus preferably be etched into the semiconductor layer sequence with the active layer in a vertical direction from a top side of the semiconductor layer sequence after the semiconductor layer sequence has been produced. It can also be advantageous if, prior to the manufacture of the trench structure, semiconductor layers in the form of a blocking pn-junction or an electrically poorly conducting or electrically insulating semiconductor layer such as an undoped layer are applied above the active layer within the framework of the manufacture of the semiconductor layer sequence. By patterned application of such semiconductor layers or by large-area application and subsequent etching of such semiconductor layers over the active area, a current-blocking structure can be epitaxially integrated into the semiconductor layer sequence that also in subsequent large-area application of an electrode layer permits current injection into the active layer only in the active area.

The trench structure may vary in a lateral direction and/or in a longitudinal direction and/or in a vertical direction with respect to properties of the at least one trench or the plurality of trenches. This may mean in particular that the trench structure has at least one trench varying with respect to one or more of its properties in one or more of the mentioned directions. In addition or alternatively, this may mean that the trench structure has at least two trenches laterally next to the active region and the at least two trenches vary relative to each other with respect to one or more of their properties in one or more of the mentioned directions. In addition or alternatively, this may also mean that the trench structure has at least three or more trenches laterally next to the active region and the three trenches vary relative to each other with respect to one or more of their properties in one or more of the mentioned directions. The properties can, for example, be selected from the following list: width, in particular measured in the lateral direction; depth, in particular measured in the vertical direction; length, in particular measured in the longitudinal direction; direction, in particular characterized by a varying direction vector in a plane parallel to the main extension plane of the active layer; position, in particular characterized by a position variation in longitudinal and/or lateral and/or vertical directions; cross section, in particular measured in a section plane perpendicular to the longitudinal direction. Quantitative information on the properties of the trench structure may in particular be upper and lower limits for mean values or absolute upper and lower limits.

In particular, the trench structure may comprise at least one trench having one or more of the following variations: a varying width, a varying depth, a varying direction, a varying cross section. The at least one trench can thus, for example, become wider or narrower with increasing distance to the light outcoupling surface and/or to the rear surface and/or become deeper or flatter with increasing distance to the light outcoupling surface and/or to the rear surface and/or once or multiple times be bent and/or be kinked and/or change its cross-sectional shape. Possible different cross-sectional shapes are rectangular, i.e. with side surfaces parallel to the vertical direction and a bottom surface parallel to the lateral direction; triangular, i.e. with side surfaces running towards each other at an angle with respect to the vertical and lateral directions and meeting in a corner forming the trench bottom; trapezoidal, i.e. with side surfaces running towards or away from one another, running obliquely with respect to the vertical and lateral directions, and a bottom surface parallel to the lateral direction; parallelogram-shaped, i.e. with side surfaces running obliquely with respect to the vertical and lateral directions, running parallel to one another, and a bottom surface parallel to the lateral direction; rounded, i.e. at least partially circular, elliptical and/or parabolic. The described cross-sectional shapes can also be combined with one another and/or, for example, have bottom surfaces that run obliquely to the lateral direction or are rounded. If the cross-sectional shape varies, this can in particular mean that the trench has a first cross-sectional shape at one point along the longitudinal direction and a second cross-sectional shape at a further point. In between, the first cross-sectional shape can change into the second cross-sectional shape.

Furthermore, the trench structure may have at least two trenches on one side laterally next to the active region that have one or more of the following variations: a varying distance from one another, in particular with a distance from the light outcoupling surface becoming greater or smaller and/or with a distance from the rear side surface becoming greater or smaller; lengths differing from one another; depths differing from one another; widths differing from one another; longitudinal positions differing from one another, i.e. an arrangement offset or partially offset in the longitudinal direction; vertical positions differing from one another, i.e. an arrangement in top side regions with different heights; fillings differing from one another; coatings differing from one another; cross sections differing from one another. In varying widths and/or depths, the trench structure may, for example, have two trenches with different widths or width variations and/or different depths or depth variations on one side laterally next to the active area.

Furthermore, the trench structure may have at least three laterally adjacent trenches on one side laterally next to the active region, a central one of the at least three trenches having a different distance from the two adjacent ones of the at least three trenches. In other words, the middle one of the three trenches may be closer to one than to the other of the two other trenches. In particular, the three trenches are directly adjacent to each other so that no further trenches are arranged between the middle trench and the outer trenches.

If the trench structure has on one side laterally next to the active area a plurality of two or more trenches, two or more or all of this plurality of trenches may also be the same with respect to one or more or all of the properties, for example, with respect to their length, depth, width, direction, position, filling and/or coating. The properties of trenches of the trench structure described below can apply to one, several or even all of the trenches of the trench structure.

The trench structure may have at least one trench containing a gas. For example, the gas may contain air, components of air, process gases and/or reaction products, parts and/or residues of process gases used in at least one process step during the manufacture of the semiconductor laser diode. For example, the gas may contain one or more selected from oxygen, nitrogen and argon. Furthermore, the gas may additionally or alternatively also contain or be intentionally introduced materials such as $CO_2$, $SF_6$, hydrocarbons, $H_2O$, $H_2$, He. Due to the gas filling, the refractive index in the trench can be about 1 so that at the interface between the semiconductor material and the gas on one side wall of the trench a significantly higher refractive index jump can be achieved than in a conventional passivation.

The trench structure may have at least one trench at least partially filled with a solid material. This may mean that the trench is at least partially or completely filled with the solid material from a bottom surface upwards to the top side of the semiconductor layer sequence. It can be particularly advantageous in this example if the trench is filled with a porous material that may have a lower refractive index than a corresponding non-porous material due to pores in the nanometer range. For example, a spin-on glass can be spun on to produce the porous material. Furthermore, beads of an oxide or nitride, for example, $SiO_2$ beads with a diameter in the nanometer range, can be filled into the trench and at least partially sintered there. In addition, the filling may also have or be made of a different solid material such as $YVO_x$. Furthermore, this can also mean that the trench is at least partially coated with a coating, i.e. one or more layers, on side surfaces. In other words, the trench may have at least one surface completely or partially covered with one or more layers. Particularly preferably, the trench may have two laterally opposed side surfaces each covered with one or more layers, the layer or layers on one side surface being spaced from the layer or layers on the other side surface so that there is a gas-filled gap therebetween. Furthermore, the trench may have a bottom surface covered with the coating. In particular, the coating may have a thickness of less than a wavelength of the light generated in the active layer during operation of the semiconductor laser diode. Wavelength specifications, unless otherwise described, refer to the wavelength in the semiconductor material of the semiconductor layer sequence and, in particular, of the active layer. Due to the low thickness, the effective refractive index jump between the coating and the gas-filled gap is greater than the refractive index jump that would exist between the semiconductor material and the coating material with a much greater layer thickness, i.e. in particular at a layer thickness of a multiple of the wavelength. For the production of a coating, a process may be particularly suitable that enables a conformal coating even of trenches with a large aspect ratio, i.e. in particular with a large depth compared to the width. For example, atomic layer deposition processes or molecular layer deposition processes can be used. As coating materials, oxides, nitrides and oxynitrides with aluminum, silicon, titanium, tantalum, rhodium, hafnium, chromium and other metals and semi-metals can be particularly suitable.

The trench structure may have at least one trench or a plurality of trenches covered with a covering material forming a covering layer so that one or each of the trenches covered with the covering material forms a cavity together with the covering material. In particular, such a cavity may be filled with a gas and/or partly with a solid material as described above. The covering material may, for example, be an electrically insulating or semiconducting or electrically conducting material and may, for example, be applied by a deposition process that cannot fill the trench. This is possible by a suitable combination of the trench dimensions as described below and the application method. Suitable application processes may include sputtering, evaporation or chemical vapor deposition. Suitable materials can be, for example, oxides, nitrides and oxynitrides with aluminum, silicon, titanium and other metals and semimetals as well as metals and metal alloys. In a metal or a metal alloy, the covering layer formed by the covering material can also be formed, for example, by an electrode layer applied to the semiconductor layer sequence for contacting. Furthermore, it may also be possible that, after the manufacture of the one or more trenches, the trench structure is epitaxially overgrown with a semiconductor material such as a semiconductor material on which the semiconductor layer sequence is also based.

The semiconductor layer sequence may have a ridge waveguide structure. The ridge waveguide structure can in particular be formed by a ridge-shaped, longitudinally extending elevated area of the semiconductor layer sequence. The side surfaces bounding the ridge waveguide structure in the lateral direction can form a step profile, especially with the adjacent surface areas of the top side of the semiconductor layer sequence. The trench structure may have at least one trench arranged in the ridge waveguide structure. Alternatively or additionally, the trench structure may have at least one trench located laterally next to the ridge waveguide structure. If the trench structure has at least two trenches on one side laterally next to the active region, one of the trenches may be located on the ridge waveguide structure and the other one next to the ridge waveguide structure so that the two trenches may have different heights and thus a variation in the vertical direction.

The trench structure may have at least one trench with a width of less than or equal to 1000 nm or less than or equal to 700 nm or less than or equal to 500 nm or less than or equal to 300 nm. Furthermore, the trench can have a width of greater than or equal to 10 nm. In particular, the width of the trench may be smaller than the wavelength of the light generated in the active region during operation of the semiconductor laser diode. The width of the trench can preferably be half the wavelength of the light generated in the active region during operation of the semiconductor laser diode, i.e. it can substantially correspond to half the wavelength. Expressions such as "within the range . . . " and "substantially correspond . . . " can mean a relative deviation of less than or equal to 20% or less than or equal to 10% or less than or equal to 5% or less than or equal to 2% or less than or equal to 1%.

The trench structure may have at least one trench having a depth, measured from the top side of the semiconductor layer sequence, of greater than or equal to 50 nm or greater than or equal to 100 nm or greater than or equal to 200 nm or greater than or equal to 500 nm. Furthermore, the trench may have a depth of less than or equal to 7000 nm or less than or equal to 5000 nm or less than or equal to 2000 nm or less than or equal to 1000 nm or less than or equal to 900 nm. Depending on the thickness of the layers of the semiconductor layer sequence, the trench structure can therefore have a trench that extends into a waveguide layer or a cladding layer above the active layer so that the trench does not extend to the active layer. Furthermore, the trench can extend into the active layer or even through the active layer into a waveguide layer or cladding layer underneath the active layer. Still further, the trench can also extend through all semiconductor layers to the surface of the substrate facing the semiconductor layer sequence or even into the substrate. If the trench structure has several trenches, these can reach into different layers.

The trench structure on one side laterally next to the active area may have at least two immediately adjacent trenches having a distance greater than or equal to 10 nm or greater than or equal to 50 nm or greater than or equal to 100 nm or greater than or equal to 200 nm. The fact that two trenches are immediately adjacent to each other may mean in particular that no further trench is located between these two trenches. Furthermore, the two trenches may have a distance of less than or equal to 5000 nm or less than or equal to 3000 nm or less than or equal to 2000 nm or less than or equal to 1000 nm or less than or equal to 700 nm or less than or equal to 500 nm or less than or equal to 300 nm. In particular, the distance between the two trenches may be smaller than the wavelength of the light generated in the active region during operation of the semiconductor laser diode. The distance can preferably be in the range of half the wavelength of the light generated in the active region during operation of the semiconductor laser diode, i.e. essentially half the wavelength.

Furthermore, the number of trenches, their widths, courses, and distances from each other can be selected such that the trench structure on one side laterally next to the active area has a width of less than or equal to 10 μm. In other words, the distance between the outermost trench wall in the lateral direction and a center and symmetry plane perpendicular to the lateral direction through the active region is less than or equal to 10 μm. If the trench structure is present on both sides laterally next to the active area as explained below, the trench structure can have a total width of less than or equal to 20 μm accordingly.

The trench structure may have at least one trench or a plurality of trenches on both sides laterally next to the active area. The number of trenches on both sides can be the same or different. On each side, one or more of the trenches or the majority of trenches may have one or more of the characteristics described above. In particular, the trench structure may be symmetrical to a plane of symmetry spanning in the longitudinal and vertical directions and extending through the active area, in particular through a center of the active area in the lateral direction. Put simply, the trench structure has a mirror symmetry when viewed from the top side of the semiconductor layer sequence. Alternatively, the trench structure may comprise at least one trench and at least one further trench between which the active region is arranged in the lateral direction, wherein the at least one trench and the at least one further trench each have a varying direction and are translationally symmetrical with respect to a lateral direction.

By the described characteristics of the trench structure and in particular by a suitable combination thereof with respect to one and in particular a plurality of trenches on one side or on both sides of the active area, it may be possible to control the lateral index guidance of the light generated in the semiconductor laser diode during operation. This can be achieved, as described, by introducing trenches, for example, by etching into the semiconductor material laterally along the guidance area of the light mode, which results in the active area, wherein these trenches may have different lengths, widths, depths, distances and/or fillings and/or correspondingly varying parameters of this kind to set the desired refractive index profile. Depending on the structure of the trenches in relation to the mode to be guided, it is possible to guide the mode precisely by a respective refractive index jump on the side surfaces of the trenches, which can be particularly large, especially in a gas filling such as air so that a hard guidance can be achieved. Simulations have shown, for example, that a trench filling with a gas such as air and thus a refractive index of about 1 in the trench compared to a complete trench filling with a conventional passivation material such as a suitable oxide or nitride, with a typical refractive index of about 2.2 can lead to an increase in the refractive index jump at the trench side surface of up to about 50%.

In this way, the described method and the associated achievement of the mode guidance can also make it possible, for example, to vary the guidance behavior of the mode along the active area in a simple way to obtain a specifically adapted far field. The trench structure can be used for ridge waveguide lasers as well as for broad-area lasers without a ridge waveguide structure. The width of the trenches is chosen so narrow that they form a cavity and thus gas inclusions when depositing a covering material to form a covering layer using conventional processes such as sputtering, evaporation or chemical vapor deposition or epitaxial overgrowth. The trenches are therefore not filled by the covering material forming the covering layer, but merely closed. This allows gas inclusions to form on their own without the need to etch free the corresponding trenches after applying a passivation layer to the semiconductor layer sequence. The covering layer can also prevent metal from penetrating into the trenches, for example, when applying an electrode layer or a bond pad.

Further advantages and developments are revealed by the examples described below in connection with the figures.

In the examples and figures, identical, similar or identically acting elements are provided with the same reference numerals. The elements illustrated and their size ratios to one another should not be regarded as being to scale, but rather individual elements such as, for example, layers, components, devices and regions, may have been made exaggeratedly large to illustrate them better and/or to aid comprehension.

Figure 1B:
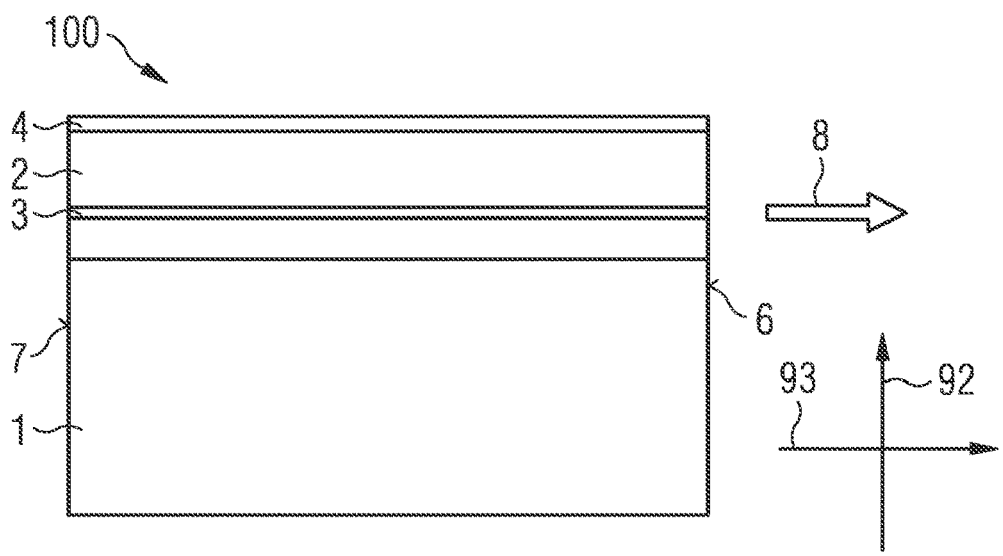

FIGS. 1A and 1B show an example of a semiconductor laser diode 100, wherein FIG. 1A shows a view onto the light outcoupling surface 6 and FIG. 1B shows a section through the semiconductor laser diode 100 with a section plane perpendicular to the light outcoupling surface 6. The following description refers equally to FIGS. 1A and 1B.

The semiconductor laser diode 100 has a substrate 1 that is, for example, a growth substrate for a semiconductor layer sequence 2 epitaxially grown on it. Alternatively, the substrate 1 can also be a carrier substrate to which a semiconductor layer sequence 2 grown on a growth substrate is transferred after growth. For example, the substrate 1 may be GaN on which a semiconductor layer sequence 2 based on an InAlGaN compound semiconductor material has been grown. In addition, other materials, in particular as described in the general part, are also possible to be used for the substrate 1 and the semiconductor layer sequence 2. Alternatively, it is also possible that the semiconductor laser diode 100 is free of a substrate. In this example, the semiconductor layer sequence 2 may have been grown on a growth substrate which has subsequently been removed. The semiconductor layer sequence 2 has an active layer 3 that generates light 8 during operation, especially laser light when the laser threshold is exceeded, and emits the light 8 via the light outcoupling surface 6.

As indicated in FIGS. 1A and 1B, the lateral direction 91 is a direction parallel to a main extension direction of the layers of the semiconductor layer sequence 2 when viewed onto the light outcoupling surface 6. The arrangement direction of the layers of the semiconductor layer sequence 2 on top of each other and of the semiconductor layer sequence 2 on the substrate 1 is referred to as the vertical direction. The direction which is perpendicular to the lateral direction 91 and to the vertical direction 92 and corresponds to the direction in which the light 8 is emitted, is referred to as the longitudinal direction 93.

An electrode layer 4 provided for electrically contacting the semiconductor layer sequence 2 is applied to a side of the semiconductor layer sequence 2 facing away from the substrate 1. For example, the electrode layer 4 may contain one or more of the following metals: Ag, Al, Au, Pt. The semiconductor laser diode 100 may have an additional electrode layer for electrically contacting the other side of the semiconductor layer sequence 2, which is not shown for reasons of clarity. In addition to the active layer 3, the semiconductor layer sequence 2 may contain further semiconductor layers such as cladding layers, waveguide layers, barrier layers, current expansion layers and/or current limiting layers not shown to simplify the illustration. Furthermore, the top side of the semiconductor layer sequence 2 facing away from the substrate 1 can be covered except for the area in which the electrode layer 4 contacts the semiconductor layer sequence 2 with one or more passivation layers, which are also not shown. Furthermore, reflective or partially reflective layers or layer sequences also not shown for the sake of clarity and intended for formation of an optical resonator in the semiconductor layer sequence 2, may be applied to the light outcoupling surface 6 and the opposite rear surface 7, which form side surfaces of the semiconductor layer sequence 2 and of the substrate 1.

A ridge waveguide structure 9 is formed in the top side of the semiconductor layer sequence 2 facing away from the substrate 1 by removing part of the semiconductor material from the side of the semiconductor layer sequence 2 facing away from the substrate 1. The ridge waveguide structure 9 runs in the longitudinal direction 93 and is delimited in the lateral direction 91 on both sides by side surfaces. The ridge side surfaces as well as the remaining top side of the semiconductor layer sequence 2 are covered by a passivation material 19. Due to the refractive index jump at the side surfaces of the ridge waveguide structure 9 because of the transition from the semiconductor material to the passivation material 19, an index guidance of the light produced in the active layer 3 can be effected that can substantially lead to formation of an active region 5, which indicates the region in the semiconductor layer sequence 2 in which the produced light is guided and amplified in laser operation. Alternatively, the semiconductor laser diode 100 can also be designed as a so-called broad-area laser diode without a ridge waveguide structure.

Figure 1C:
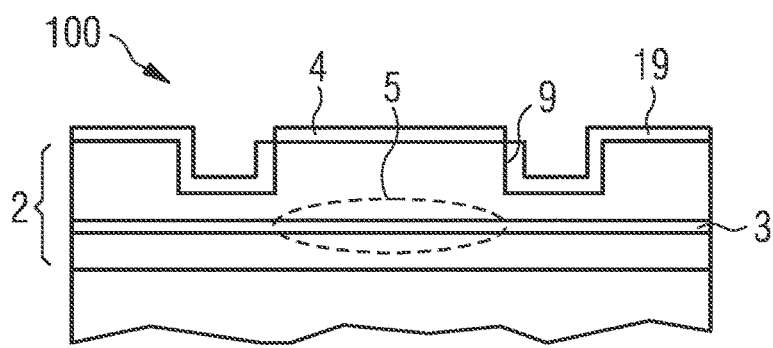

As shown in FIG. 1A, the ridge waveguide structure 9 can be formed by completely removing the semiconductor material laterally on both sides of the ridge. Alternatively, a so-called "tripod" can also be formed, as indicated in FIG. 1C in which the semiconductor material is removed laterally next to the ridge only along two grooves. In conventional semiconductor laser diodes, such grooves extend from the light outcoupling surface 6 to the rear surface 7 and are uniform along their course. In addition, the grooves are so wide in the lateral direction that a passivation material can be applied to all groove surfaces using conventional methods such as sputtering, evaporation or chemical vapor deposition (CVD).

Since the refractive index jump at the side surfaces of the ridge waveguide structure 9 is determined by the passivation material 19, the refractive index jump can only be varied within narrow limits so that a strong guidance of the laser mode due to a desired very low refractive index of the passivation material can hardly be achieved. Therefore, when producing the ridge waveguide structure 9, it must be etched very deeply into the semiconductor layer sequence 2 to achieve the desired strong index guidance. However, a high etching depth next to the ridge usually increases the risk of damage to the semiconductor structure. In addition, specific refractive index courses perpendicular to or along the emission direction cannot be set, which may result in a lack of control of the far field distribution, the facet load limit and other laser properties.

The following figures show examples of semiconductor laser diodes 100 based on the basic structure described in FIGS. 1A to 1C, but additionally have a trench structure with at least one trench or a plurality of trenches, respectively, the trench structure varying in a lateral direction and/or in a longitudinal direction and/or in a vertical direction with respect to properties of the at least one trench or the plurality of trenches. The following description mainly refers to the differences to the examples described in FIGS. 1A to 1C, other features of the shown semiconductor laser diodes correspond to the features described in connection with the previous examples, unless otherwise expressly described. For the sake of clarity, the substrate and usually also the active layer are not shown in the following figures.

Figure 2A:
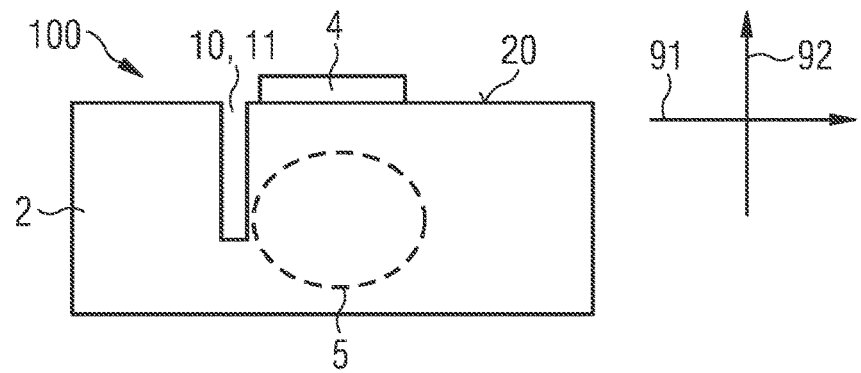
FIGS. 2A to 2H show schematic illustrations of a semiconductor laser diode with a trench structure and features of the trench structure according to several examples.

FIG. 2A shows an example of a semiconductor laser diode 100 having a trench structure 10 with a trench 11 in a top side 20 of the semiconductor layer sequence 2. The view in FIG. 2A corresponds to a sectional view through the semiconductor laser diode 100 with a sectional plane perpendicular to the longitudinal direction and thus spanned from the lateral direction 91 and the vertical direction 92, as indicated in FIG. 1A. The examples shown in FIGS. 2A to 9 show corresponding sections.

The top side 20 of the semiconductor laser diode 100 is a surface delimiting the semiconductor layer sequence 2 in the vertical direction and from which the trench 11 extends into the semiconductor layer sequence 2 in the vertical direction. In particular, the top side 20 can be a surface of the semiconductor layer sequence 2 opposite a substrate. In the example of FIG. 2A, the top side 20 is plane except for the trench structure 10. An etching process can be used to produce the trench structure 10.

The trench 11 is arranged laterally next to the active area 5 as described in the general part above and has a main expansion direction in the longitudinal direction. In other words, the trench 11 runs at least partially along the active area 5. In the shown example, the trench 11 is filled with a gas, in particular air so that at the side surfaces of the trench 11, i.e. at the surfaces delimiting the trench in the lateral direction, a large refractive index jump can be achieved at the transition from the semiconductor material to the air due to the low refractive index of air of almost 1. Due to the refractive index jump caused by the trench 11 and its course, the guidance of the laser mode and thus the extent and course of the active area 5 can be set.

To set a refractive index profile, the trench 11 can vary in lateral and/or longitudinal and/or vertical directions. Examples of such variations are shown in FIGS. 2B to 2H. The shown examples can also be combined with each other.

Figure 2B:
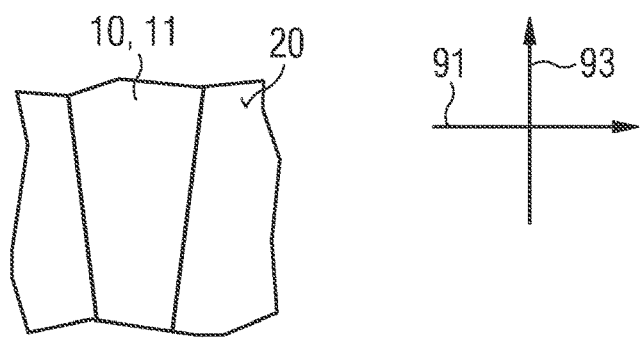

FIG. 2B shows a view on a section of the top side 20 with a section of the trench structure 10. The trench 11 has a varying width. In particular, the trench 11 may become wider or narrower as the distance to the light outcoupling surface and/or to the rear surface decreases. It is also possible that the trench 11 may have one or more thickenings and/or narrowings in terms of its width between its ends in the longitudinal direction, i.e. in other words the trench 11 may have one or more bulges and/or waistings.

Figure 2C:
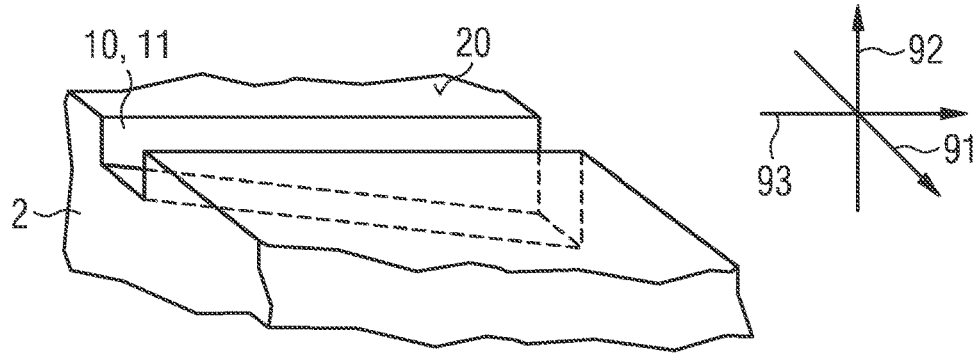
Figure 2D:
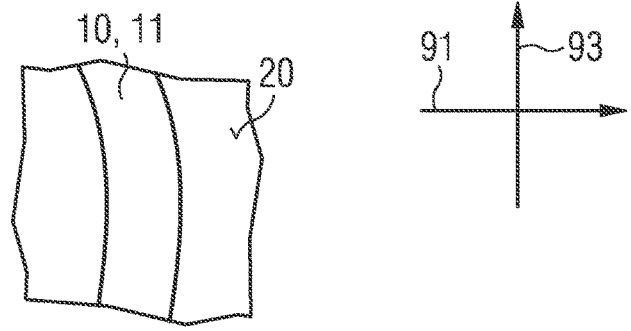

FIG. 2C shows a three-dimensional view on a section of the semiconductor layer sequence 2 with a section of the trench structure 10. The trench 11 can have a varying depth so that the trench 11 can become deeper or flatter with decreasing distance to the light outcoupling surface and/or to the rear surface. It is also possible that, with regard to its height between its ends in the longitudinal direction, the trench 11 may have one or more changes in height, in other words the trench 11 may have a bottom surface which is, for example, undulating.

FIG. 2D again shows a view on a section of the top side 20 with a section of the trench structure 10, with the trench 11 having a curved shape and thus varying in direction. The trench 11 can also have several changes of direction.

Furthermore, the trench 11 may have a fixed or a varying cross-sectional shape, in particular in a sectional plane parallel to the vertical and lateral directions 91, 92 and thus perpendicular to the longitudinal direction 93. In the previous figures a rectangular cross section is shown, i.e. a trench 11 with side surfaces parallel to the vertical direction 92 and a bottom surface parallel to the lateral direction 91.

Figure 2E:
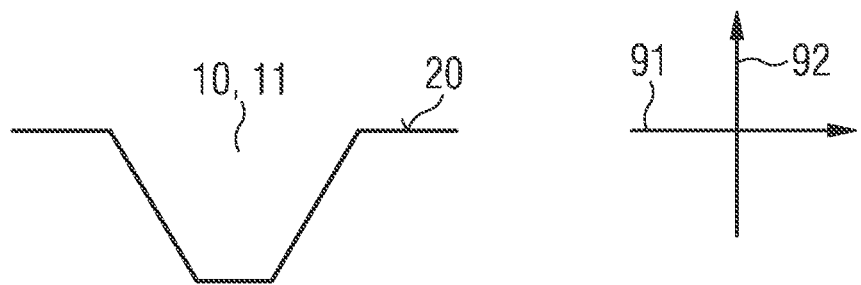
Figure 2F:
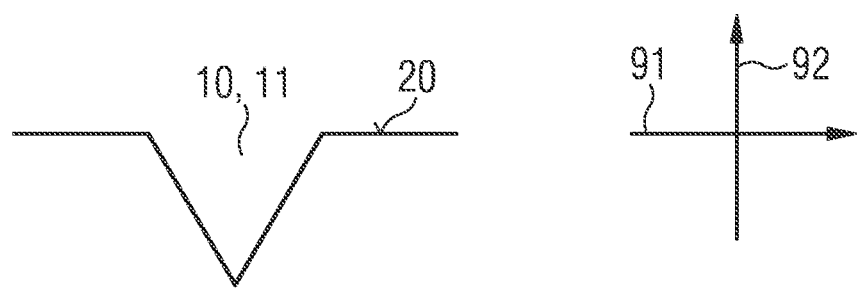
Figure 2G:
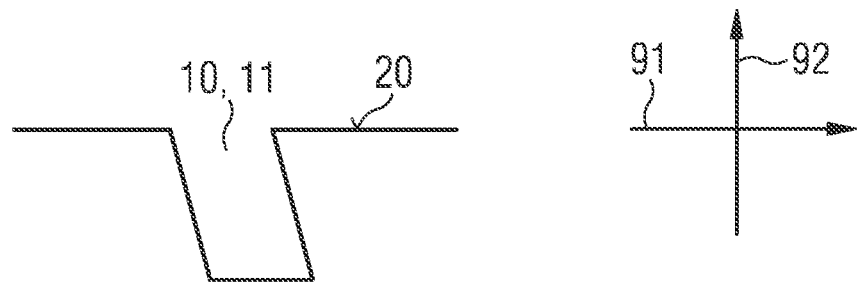
Figure 2H:
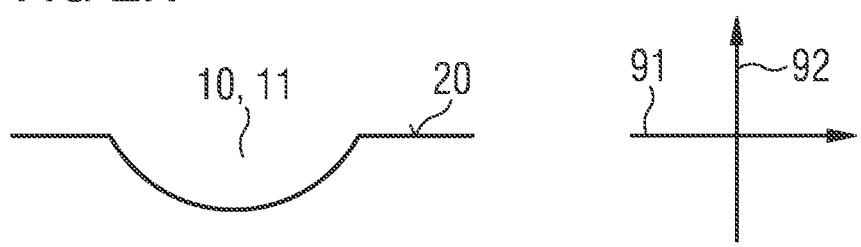

Other possible cross section shapes are shown in FIGS. 2E to 2H. FIG. 2E shows a trapezoidal cross section, i.e. with side surfaces running towards or away from each other in the lateral and vertical directions 91, 92, and a bottom face parallel to the lateral direction 91. FIG. 2F shows a triangular cross section, i.e. with side surfaces running towards each other in the lateral and vertical directions 91, 92 and being oblique to each other and meeting in a corner forming the trench bottom. FIG. 2G shows a parallelogram-shaped cross section, i.e. with inclined, parallel side surfaces with regard to lateral and vertical directions 91, 92 and a bottom surface parallel to the lateral direction 91. FIG. 2H shows a rounded cross section, i.e. at least partly circular, elliptical and/or parabolic. The shown cross section shapes can also be combined with each other. Furthermore, rectangular, trapezoidal, triangular and parallelogram-shaped cross sections are also possible with rounded corners and/or, for example, with bottom surfaces running obliquely to the lateral direction or with rounded bottom surfaces and/or with differently inclined side surfaces. If the trench 11 has inclined side surfaces, for example, as shown in FIGS. 2E to 2G, the side surfaces may preferably include an angle of greater than or equal to 60° and less than or equal to 89° with the lateral direction. In particular, the cross-sectional shape of the trench 11 may also vary in the longitudinal direction so that the trench 11 has a first cross-sectional shape at one point along the longitudinal direction and a second cross-sectional shape at another point. In between, the first cross-sectional shape can change into the second cross-sectional shape.

In the following examples, always rectangular cross-sectional shapes are shown. These can, however, be replaced by the different cross-sectional shapes described above.

The trench 11 described in connection with FIGS. 2A to 2H may have a width of less than or equal to 1000 nm or less than or equal to 700 nm or less than or equal to 500 nm or less than or equal to 300 nm, as may the trenches described in connection with the following examples. Furthermore, trench 11 as well as the trenches described in connection with the following examples may have a width greater than or equal to 10 nm. It can be particularly advantageous if the trench width is smaller than the wavelength of the light generated in the active region 5 during operation of the semiconductor laser diode 100 and is in particular in the range of half the wavelength of the light generated in the active region 5 during operation of the semiconductor laser diode 100, i.e. deviates from half the wavelength by less than or equal to 20% or less than or equal to 10% or less than or equal to 5% or less than or equal to 2% or less than or equal to 1%. Furthermore, the trench 11 and the trenches described in connection with the following examples may have a depth, measured from the top side of the semiconductor layer sequence 2, of more than or equal to 50 nm or more than or equal to 100 nm or more than or equal to 200 nm or more than or equal to 500 nm. The depth may be less than or equal to 7000 nm or less than or equal to 5000 nm or less than or equal to 2000 nm or less than or equal to 1000 nm or less than or equal to 900 nm. The specified values for the width and the depth can, in a variation of these parameters, be upper or lower limits of a mean value or, preferably, absolute upper or lower limits. Depending on the thickness of the layers of the semiconductor layer sequence 2, the trench 11 described in connection with FIGS. 2A to 2D, as well as the trenches described in connection with the following examples, may extend into a semiconductor layer, for example, a waveguide layer or a cladding layer, above the active layer so that the trench 11 does not extend to the active layer. Furthermore, the trench 11, as well as the trenches described in connection with the following examples, may extend into the active layer or even through the active layer into a semiconductor layer such as a waveguide layer or a cladding layer, located below the active layer as indicated in FIG. 2A.

Figure 3A:
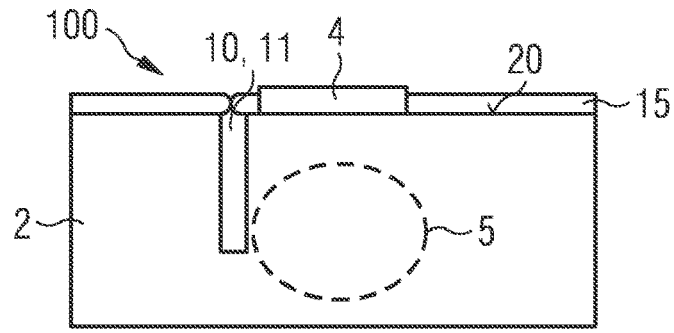
FIGS. 3A to 10N show schematic illustrations of semiconductor laser diodes according to further examples.

FIG. 3A shows a further example of a semiconductor laser diode 100 corresponding to the previous example with regard to the semiconductor layer sequence 2 and the trench structure 10, but which, in addition to the trench structure 10 described above, has a covering material 15 forming a covering layer on the upper side 20 of the semiconductor layer sequence 2. In particular, the covering material 15 as shown can cover the entire top side 20 of the semiconductor layer sequence 2, except for the area in which the electrode layer 4 is applied.

In particular, the width of the trench 11 is chosen in the range described above in particular so that the covering material 15 does not fill the trench 11, but only covers the trench 11 so that the trench 11 forms a gas-filled cavity with the covering material 15. The gas may, for example, contain air, but also, for example, components of air, process gases and/or reaction products as well as parts and/or residues of process gases which are used in at least one method step during the manufacture of the semiconductor laser diode 100. For example, the gas may contain one or more selected from oxygen, nitrogen and argon. Furthermore, the gas may additionally or alternatively also contain or be intentionally introduced materials such as $CO_2$, $SF_6$, hydrocarbons, $H_2O$, $H_2$, He. Due to the gas filling, the refractive index can again amount to about 1 in the trench 11 so that at the interface between the semiconductor material and the gas at the side surface of the trench 11 a significantly higher refractive index jump can be achieved than in a usual passivation of a wide groove as shown in FIG. 1C above. At the same time, however, the trench 11 is also closed and thus protected against the penetration of other materials.

The covering material 15 may be, for example, an electrically insulating or semi-conductive or electrically conductive material applied by a deposition process that cannot fill the trench so that the described gas confinement can be produced. Suitable application processes may include sputtering, evaporation or chemical vapor deposition. Suitable materials can be, for example, oxides, nitrides and oxynitrides with aluminum, silicon, titanium and other metals and semi-metals, as well as metals and metal alloys.

Figure 3B:
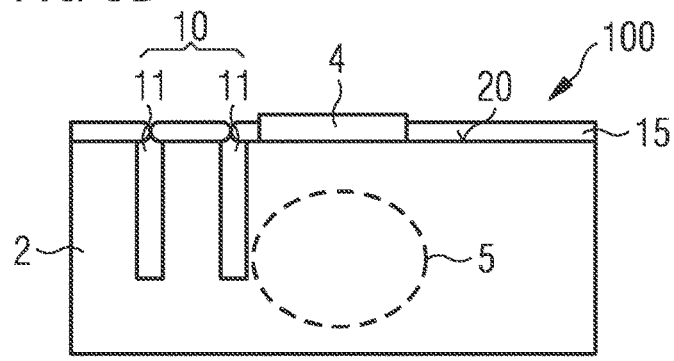

FIG. 3B shows a further example of a semiconductor laser diode 100 that has, compared to the previous example, a trench structure 10 with two trenches 11 on one side laterally next to the active area 5. As in the previous example, the trenches 11 are covered with covering material 15 and form gas-filled cavities. Alternatively, the semiconductor laser diode 100 shown in FIG. 2B can also be designed without covering material 15. The same also applies to the following examples of trench structures 10 that are covered with a covering material 15.

The two trenches 11 may have a distance greater than or equal to 10 nm or greater than or equal to 50 nm or greater than or equal to 100 nm or greater than or equal to 200 nm. Furthermore, the two trenches 11 may have a distance of less than or equal to 5000 nm or less than or equal to 3000 nm or less than or equal to 2000 nm or less than or equal to 1000 nm or less than or equal to 700 nm or less than or equal to 500 nm or less than or equal to 300 nm. In particular, the distance between the two trenches 11 may be smaller than the wavelength of the light generated in the active region 5 during operation of the semiconductor laser diode 100 and may preferably be in the range of half the wavelength of the light generated in the active region, i.e. substantially half the wavelength. The distances may also apply to adjacent trenches 11 of a trench structure 10 that has more than two trenches 11 on one side laterally next to the active area 5.

The two trenches 11 of the example of FIG. 3B may have one or more of the following variations: a varying distance from one another, in particular with increasing or decreasing distance from the light outcoupling surface and/or from the rear surface; lengths differing from one another; depths differing from one another; widths differing from one another; longitudinal positions differing from one another, i.e. an arrangement offset or partially offset in the longitudinal direction. In varying widths and/or depths, the trench structure may, for example, have two trenches with different widths or width variations and/or different depths or depth variations on one side laterally next to the active area. For example, a trench 11 may also vary in one or more of its properties according to the previous examples, while the other trench 11 will remain the same. Concrete examples of the individual variations are also shown in the following figures.

As an alternative to the two trenches 11 shown in FIG. 3B, the trench structure 10 may also have more than two trenches 11. Particularly preferably, the trench structure 10 comprises a number of less than or equal to ten trenches 11 on one side laterally next to the active area 5. For example, the trench structure 10 may also have at least three laterally adjacent trenches 11 on one side laterally next to the active area 5, a middle one of the at least three trenches 11 having a different distance from the two adjacent ones of the at least three trenches 11. In other words, the middle one of the three trenches 11 may be closer to one of the other two trenches 11 than to the other two trenches 11. The same may also apply in the case of more than three trenches 11.

Figure 3C:
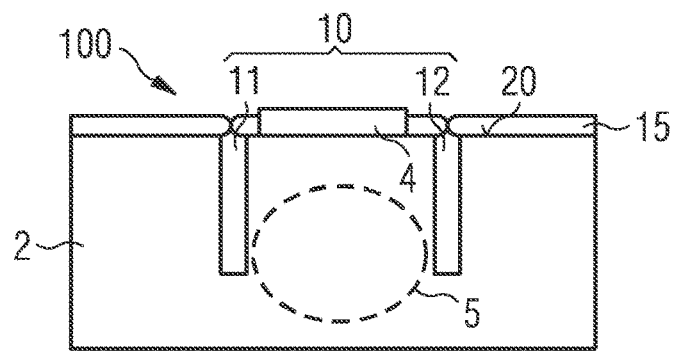

While in the above examples the trench structure 10 has trenches 11 only on one side laterally next to the active region 5, the other side being free of trenches, the semiconductor laser diode 100 of the example of FIG. 3C has a trench structure 10 which, in addition to a trench 11 on one side laterally next to the active region 5, has a further trench 12 on the other side laterally next to the active region 5. The trenches 11, 12 can be the same or different. In particular, the trench structure 10 in the example of FIG. 3C, as well as in the examples described below, may have a symmetry with the trench structure 10 formed laterally on both sides of the active area. For example, the trench structure 10 can be symmetrical in relation to a plane of symmetry perpendicular to the lateral direction and spanned accordingly by the longitudinal and vertical directions. In particular, the active area 5 can also be symmetrical to this plane of symmetry.

Figure 3D:
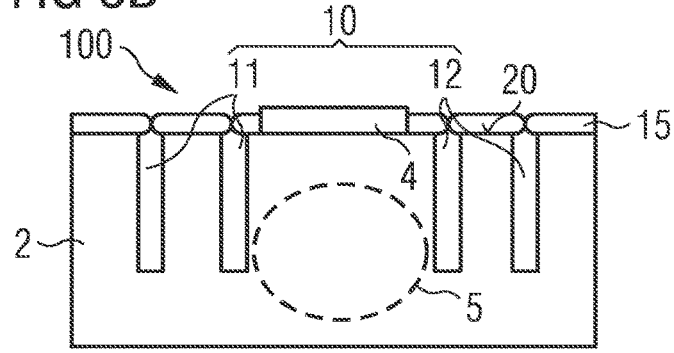

FIG. 3D shows an example of a semiconductor laser diode 100 that according to a combination of the examples of FIGS. 3B and 3C, has a plurality of trenches 11 and a plurality of trenches 12 on both sides laterally next to the active area 5. In the examples shown above and below, the number of trenches 11, 12, their widths, courses and distances from each other can be selected such that the trench structure 10 has a width of less than or equal to 10 µm on one or both sides laterally next to the active area 5.

While the semiconductor laser diodes 100 shown in FIGS. 2A to 3D have, except for the trench structure 10, plane top sides 20 of the semiconductor layer sequence 2, FIGS. 4A to 4D show examples of semiconductor laser diodes 100 having a ridge waveguide structure 9 on the top side 20. The trench structures 10 are arranged next to the ridge waveguide structure 9 and correspond to the trench structures 10 described in connection with FIGS. 3A to 3D. The covering material 15 can, as shown in FIGS. 4A to 4D, also extend onto the side surfaces of the ridge of the ridge waveguide structure 9, i.e. the surfaces which delimit the ridge in the lateral direction. In addition, the covering material 15 can also extend onto the upper side of the ridge of the ridge waveguide structure 9, i.e. the region of the ridge and thus of the top side 20, which delimits the ridge in the vertical direction, up to the region in which the electrode layer 4 is arranged, and thus cover the entire top side 20 of the semiconductor layer sequence 2 up to the region in which the electrode layer 4 is arranged.

The shown height of the ridge waveguide structure 9 is only to be understood as an example. In particular, the ridge waveguide structure 9 can also have a lower height than the one shown so that the ridge waveguide structure 9, unlike in the shown examples, cannot reach to the active layer or reach into a semiconductor layer below the active layer, but can only reach into a semiconductor layer arranged above the active layer.

Figure 4E:
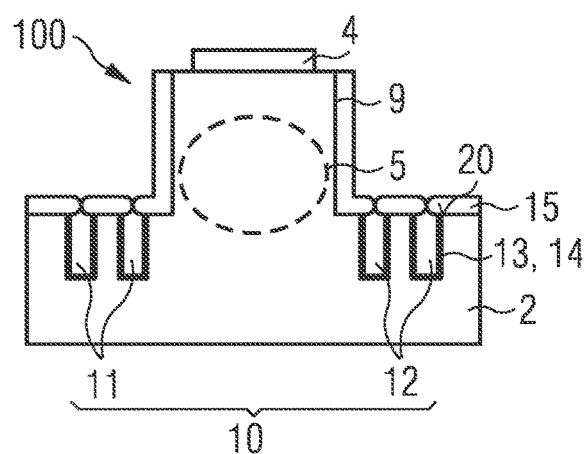
Figure 4F:
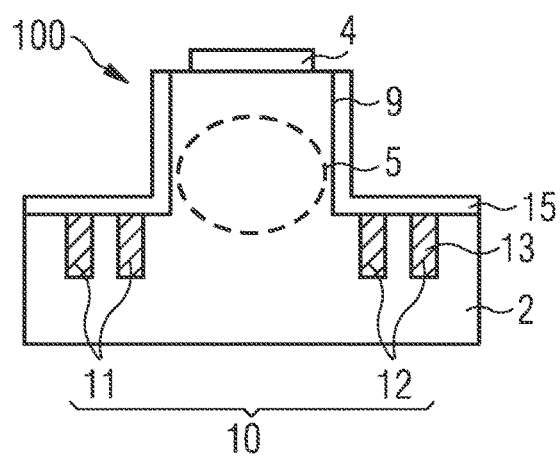
Figure 4G:
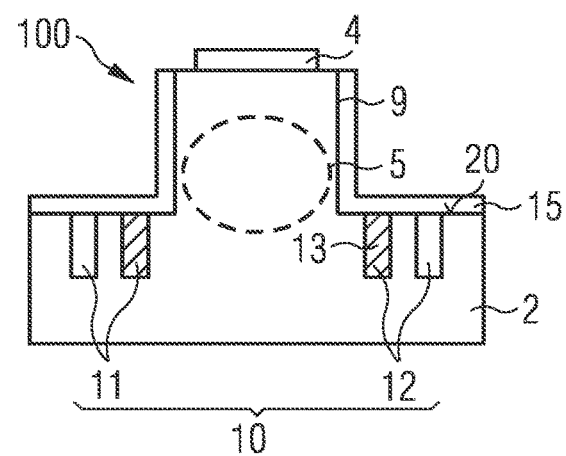

FIGS. 4E to 4G show examples of semiconductor laser diodes 100 with a trench structure 10 as illustrated in FIG. 4D, where at least one trench 11, 12 that is at least partially filled with a solid material 13 is additionally present.

FIG. 4E shows a semiconductor laser diode 100 having trenches 11, 12 at least partially coated on side surfaces with a coating, i.e. one or more layers 14, as a solid material 13. In particular, each of the trenches 11, 12 provided with at least one layer 14 may have at least one surface covered with one or more layers 14. Particularly preferably, a coated trench 11, 12 may have two laterally opposed side surfaces each covered with one or more layers 14, the layer 14 or multiple layers 14 on one side surface being spaced from the layer 14 or multiple layers 14 on the other side surface so that there is a gas-filled gap therebetween. A coated trench 11, 12 is thus still partially filled with gas. The thickness of the one or more layers 14 is chosen accordingly in relation to the width of the coated trench 11, 12. The coating may preferably have a thickness smaller than a wavelength of the light generated in the active layer during operation of the semiconductor laser diode 100. Furthermore, a coated trench 11, 12, as shown in FIG. 4E, may have a bottom surface covered with the coating. For the production of the one or more layers 14, a method can be chosen which allows a conformal coating even of trenches 11, 12 with a large aspect ratio, i.e. in particular a large depth compared to the width, without the coated trench becoming grown over. For example, atomic layer deposition processes or molecular layer deposition processes can be used. Oxides, nitrides and oxynitrides with aluminum, silicon, titanium and other metals and semi-metals can be particularly suitable as coating materials. As an alternative to the example shown in FIG. 4E, in which all trenches 11, 12 are coated, only a few trenches 11, 12 can be coated.

FIG. 4F shows an example for a semiconductor laser diode 100 that, compared to the previous example, has a trench structure 10 with trenches 11, 12 completely filled with a solid material from a bottom surface upwards towards the top side of the semiconductor layer sequence. Alternatively, the trenches 11, 12 can also only be partially filled with the solid material 13, i.e. up to a height below the top side 20. It is particularly advantageous if a filled or partially filled trench 11, 12 is filled with a porous solid material 13 that may have a lower refractive index than a corresponding non-porous material due to pores in the nanometer range. A spin-on glass, for example, can be spun on to produce the porous solid material. Furthermore, beads of an oxide or nitride, for example, $SiO_2$ beads with a diameter in the nanometer range can also be filled into the trench and at least partially sintered there. Alternatively or in addition to this, the trench filling may have or be made of the same material as the covering material 15. The filling may preferably be made of a different material than the covering material 15. The filling can also be layered, i.e. formed by a plurality of layers and, in this example, have a plurality of materials. Furthermore, the filling may also have or be made of a different solid material such as $YVO_x$.

As an alternative to the example shown in FIG. 4E, in which all trenches 11, 12 are filled with a solid material 13, only a few trenches 11, 12 can be filled. An example of this is shown in FIG. 4G, where only the two trenches 11, 12 closest to the active area are filled with the solid material, while the more distant trenches 11, 12 are free from such filling, resulting in a variation of the trench structure 10 in the lateral direction.

Figure 4H:
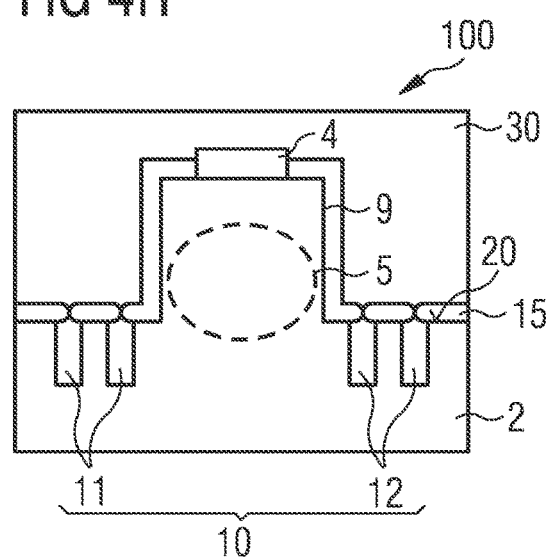

FIG. 4H shows an example for a semiconductor laser diode 100 like the example of FIG. 4D and additionally has a bond pad 30 above the top layer 14 and the electrode layer 4 on the top side 20 of the semiconductor layer sequence 2. The bond pad 30 can, for example, be applied by vapor deposition and be a metal or a metal alloy with or made of one or more of the following metals: Al, Ag, Au, Pt. Accordingly, the semiconductor laser diodes 100 of the other shown example can also have a bond pad.

Figure 4I:
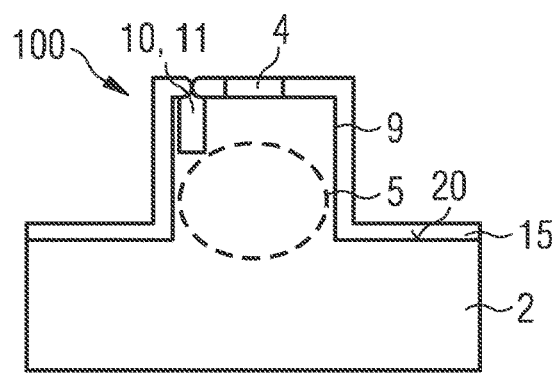
Figure 4J:
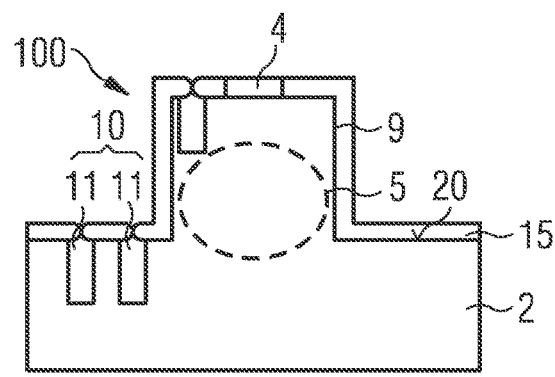
Figure 4K:
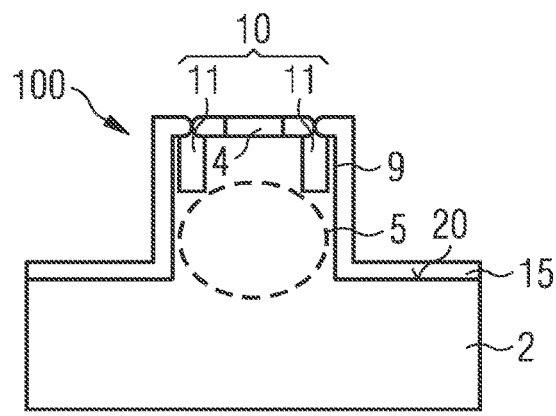
Figure 4L:
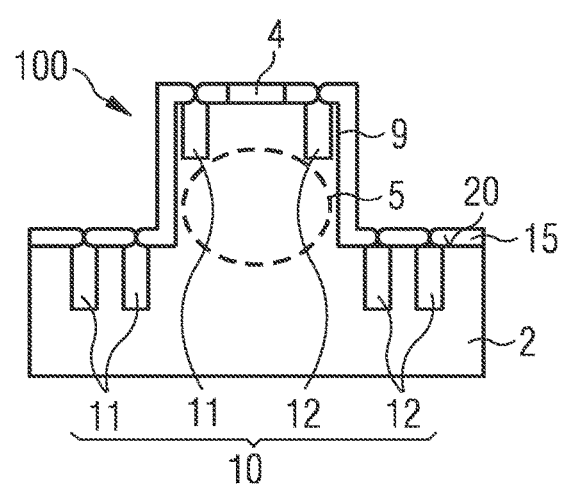

FIGS. 4I to 4L show examples of semiconductor laser diodes 100 with trench structures 10 with trenches 11, 12 in different vertical positions. The shown semiconductor laser diodes 100 have trenches 11, 12, of which at least one is arranged in the ridge waveguide structure 9. In other words, at least one trench 11, 12 is arranged in that part of the top side 20 which also forms the top side of the ridge waveguide structure 9. As shown in FIG. 4I, for example, only one trench 11 can be located on one side laterally next to the active area 5 in the ridge waveguide structure 9. The variation possibilities of the one trench 11 correspond to the variation possibilities previously discussed, for example, in connection with FIGS. 2A to 2D. FIG. 4J shows an example in which a plurality of trenches 11 is arranged on one side laterally next to the active region 5, with a trench 11 being arranged in the ridge waveguide structure 9 and further trenches 11 being arranged next to the ridge waveguide structure 9 in the top side 20 of the semiconductor layer sequence 2. Such a configuration includes a variation of the trench structure 10 in the vertical direction due to the trenches 11 arranged at different heights. Furthermore, the two trenches 11 arranged next to the ridge waveguide structure 9 also have different depths, whereby a corresponding graduated arrangement is also possible. FIGS. 4K and 4L show corresponding trench structures 10 with a lateral double-sided arrangement of trenches 11, 12 on the ridge waveguide structure 9 as well as on and beside the ridge waveguide structure 9. As an alternative to the shown examples, there may also be more than one trench 11, 12 laterally next to the active area 5 on at least one side of the active area on the ridge waveguide structure 9 that may exhibit variations according to the previous examples.

Figure 5A:
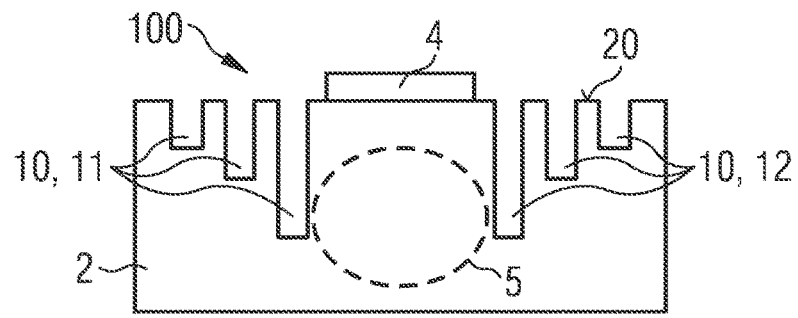
Figure 5B:
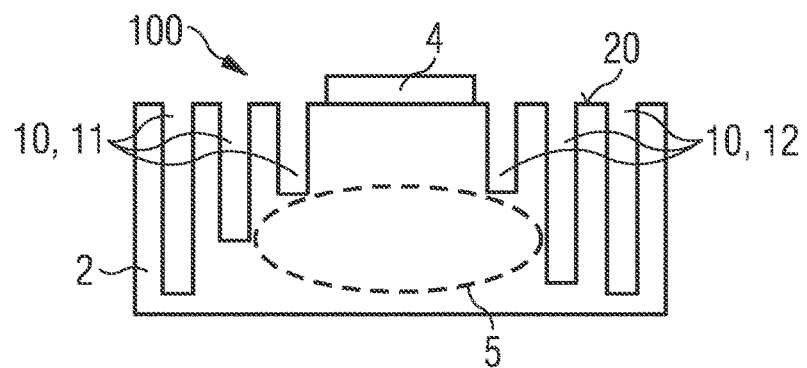
Figure 5C:
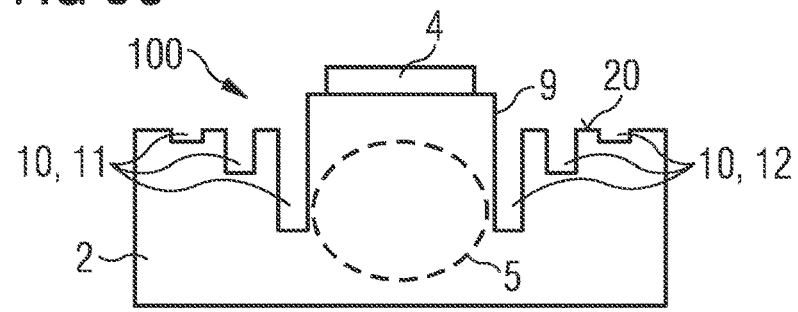
Figure 5D:
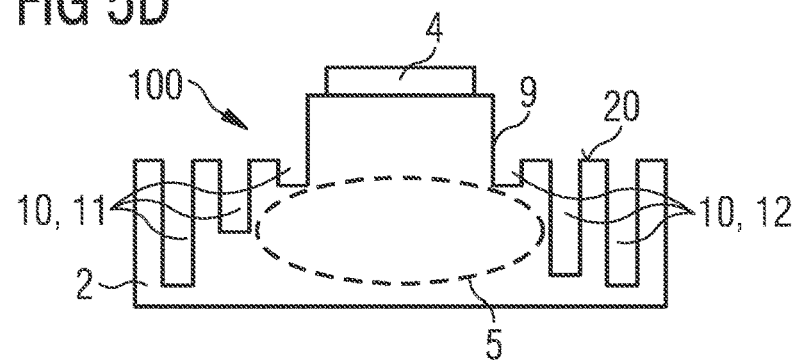
Figure 6A:
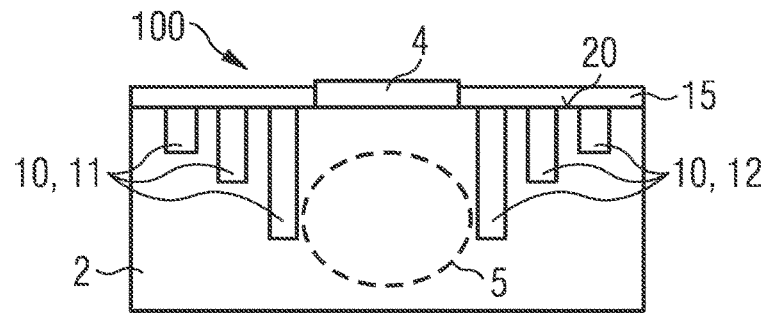
Figure 6B:
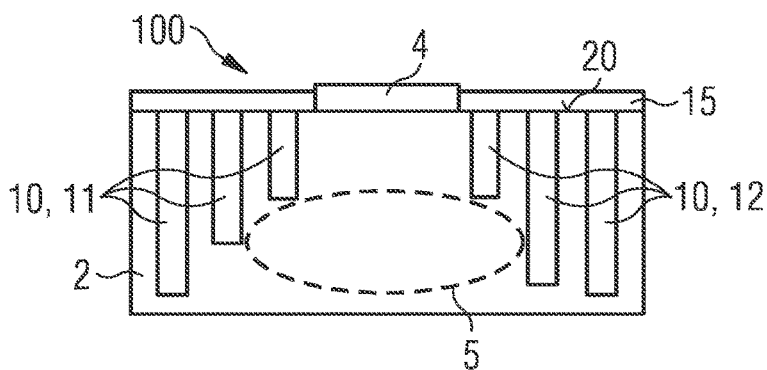
Figure 6C:
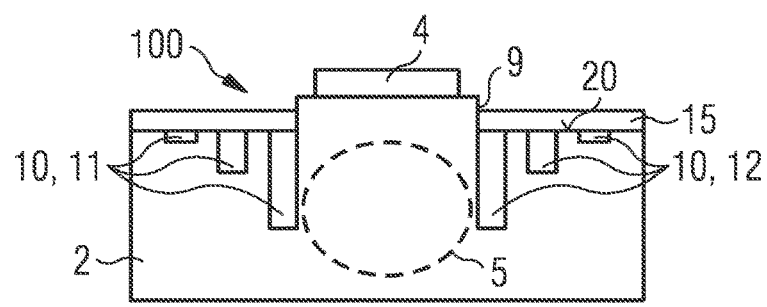
Figure 6D:
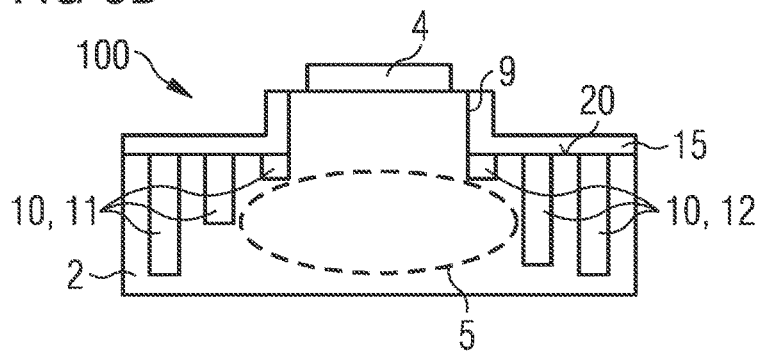
Figure 7A:
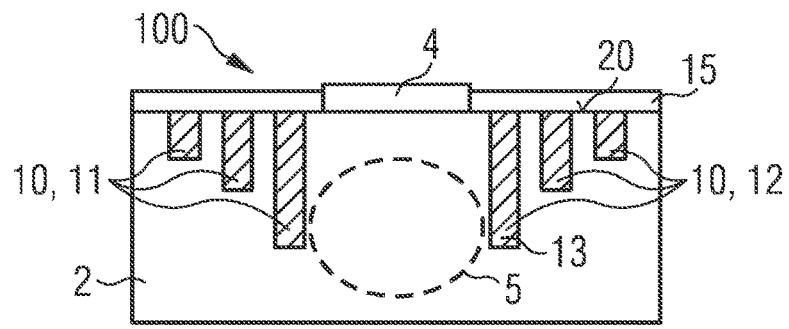
Figure 7B:
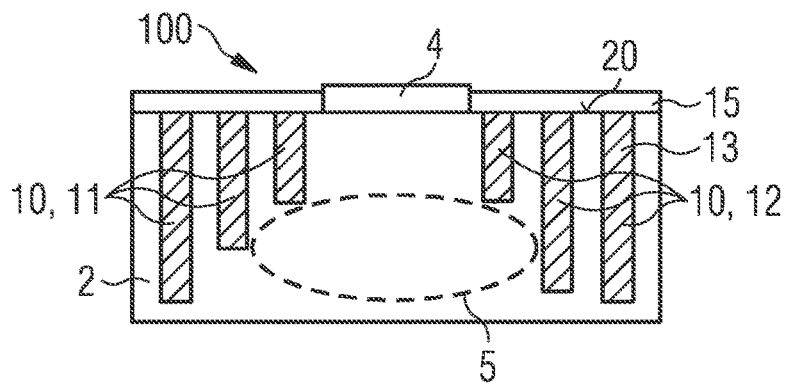
Figure 7C:
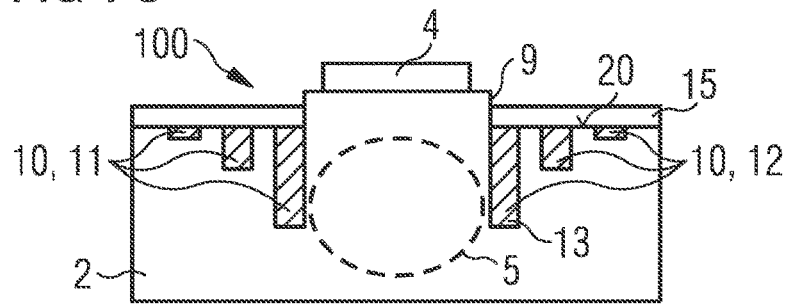
Figure 7D:
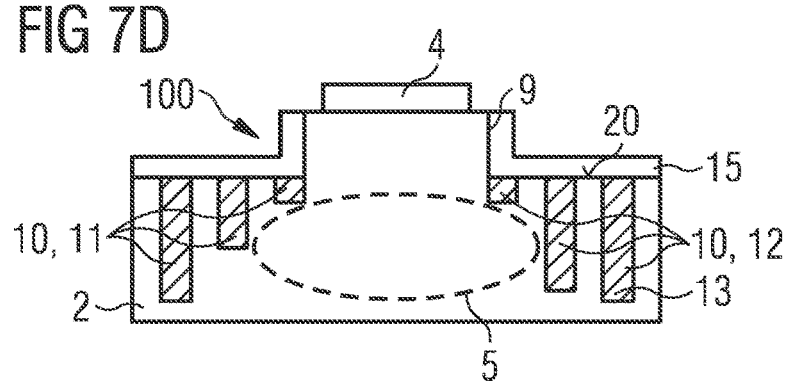

FIGS. 5A to 5D show further examples of semiconductor laser diodes 100, each of which has a trench structure 10, wherein each of the trench structures has three trenches 11, 12 on both sides laterally next to the active area 5, respectively, wherein the trenches 11 and 12 vary at least with regard to their depths. The semiconductor laser diode 100 of the example in FIG. 5A has trenches 11, 12 having increasing depths with decreasing distance to the active area 5. FIG. 5B shows an example where the depths of the trenches 11, 12 increases with increasing distance to the active area 5. The examples of FIGS. 5C and 5D correspond to the examples of FIGS. 5A and 5B with regard to the trench structure 10 and additionally comprise a ridge waveguide structure 9.

FIGS. 6A to 6D show semiconductor laser diodes 100 corresponding to the examples of FIGS. 5A to 5D and additionally have a covering material 15 on the top side 20 of the semiconductor layer sequence 2.

The examples of FIGS. 7A to 7D correspond to the examples of FIGS. 6A to 6D and additionally comprise a solid material 13 as described above in connection with FIGS. 4E and 4F. In particular, the material 13 may fill the trenches 11, 12 in whole or in part or may also be a coating for the trench walls as described in FIG. 4E.

Figure 8A:
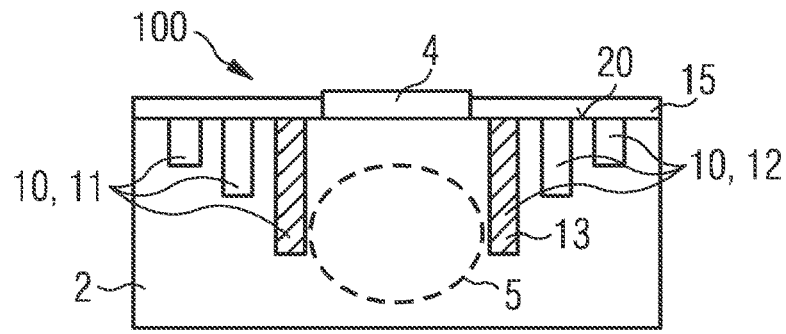
Figure 8B:
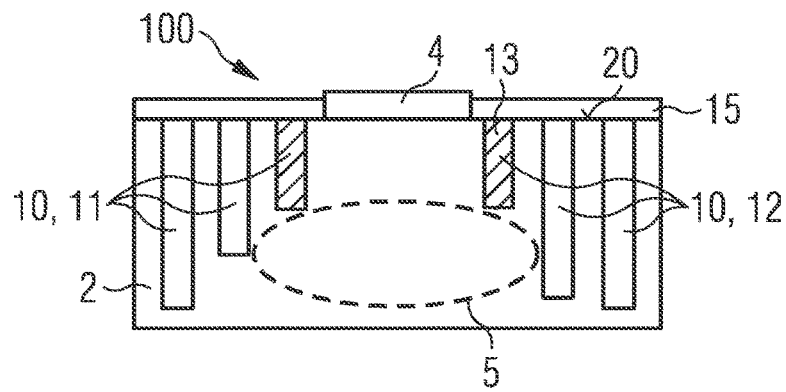
Figure 8C:
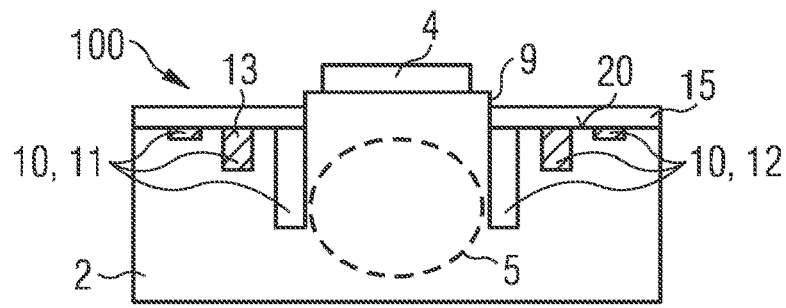
Figure 8D:
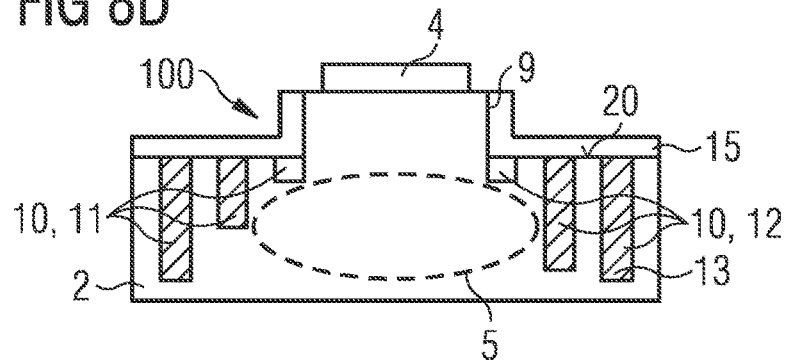

As shown in FIGS. 8A to 8D, the trenches 11, 12 can also be filled differently, as described above in connection with FIG. 4G. For example, only the trenches 11, 12 closest to the active area 5 can be filled with solid material 13, as shown in FIGS. 8A and 8B or, alternatively, the trenches 11, 12 closest to the active area 5 can be the only ones free of solid material 13 as shown in FIGS. 8C and 8D. Alternatively, other combinations of filled, coated and unfilled as well as uncoated trenches 11, 12 are also possible.

Figure 9:
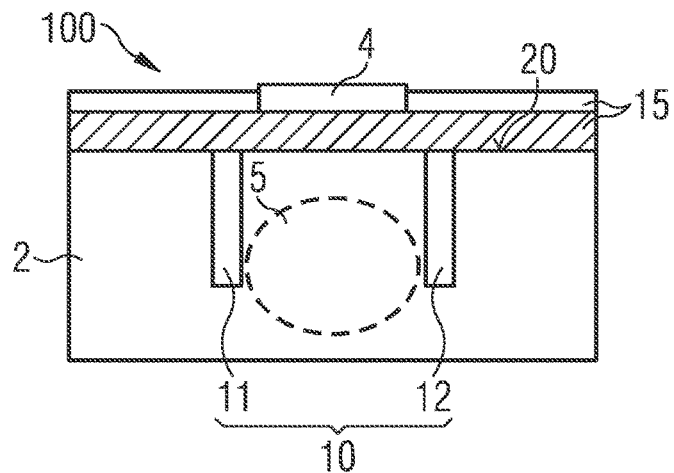

FIG. 9 shows a further example of a semiconductor laser diode 100 in which the trenches 11, 12 of the trench structure 10 that purely exemplarily corresponds to the trench structure 10 described in connection with FIG. 3C, are covered with a covering material 15 on the top side 20 of semiconductor layer sequence 2 comprising an epitaxially grown semiconductor material. This makes it possible to produce a closed semiconductor surface that can result in advantages due to a simpler chip processing. In addition, as shown in FIG. 9, a further covering material 15 may also be applied to the semiconductor material, e.g. an electrically insulating material as described above.

Figure 10A:
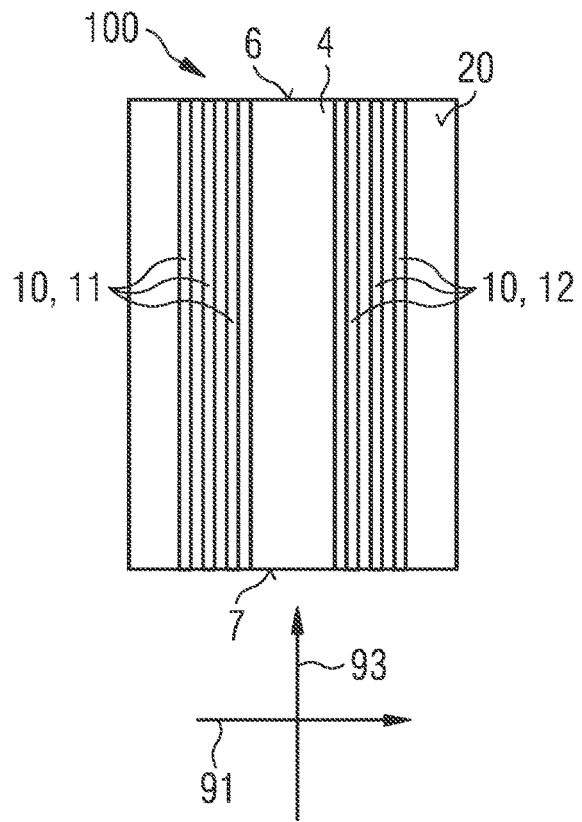

FIGS. 10A to 10M show views of semiconductor laser diodes 100 in a vertical direction on the top side 20. In FIG. 10A the lateral direction 91 and the longitudinal direction 93 are drawn for illustration. Although FIGS. 10A to 10G and 10J to 10N show trenches 11, 12 that substantially extend straight in the longitudinal direction, some or all of these trenches may also have curved courses in the illustrated plane. Furthermore, the shown numbers of trenches each are only to be understood as examples and may vary depending on the desired light guidance properties.

FIG. 10A shows an example for a semiconductor laser diode 100 with a trench structure 10 which has three trenches 11, 12 on both sides laterally next to the active area, wherein more or fewer trenches 11, 12 are possible according to the description of the previous examples. The trenches 11, 12 that thus run along the mode guidance region and, in the shown example, all extend from the rear surface 7 to the light outcoupling surface 6 can, for example, be as described in connection with FIGS. 5A to 5D. Furthermore, directly adjacent trenches 11, 12, for example, can also have different distances. In addition, for example, different numbers of trenches 11, 12 are also possible.

Figure 10B:
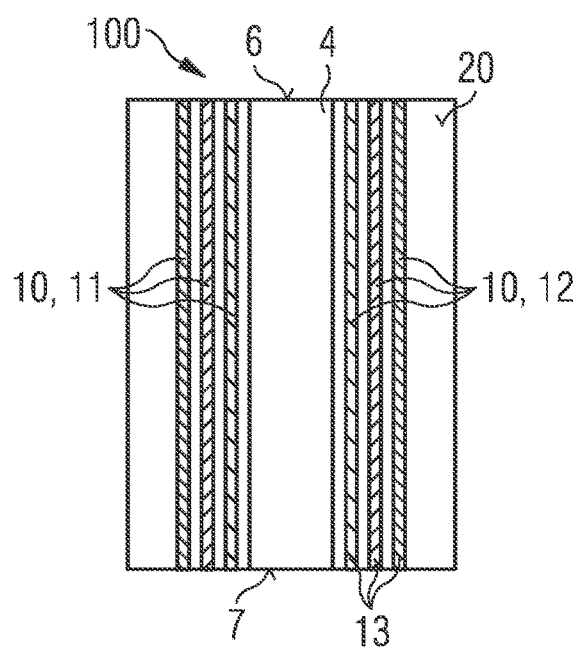
Figure 10C:
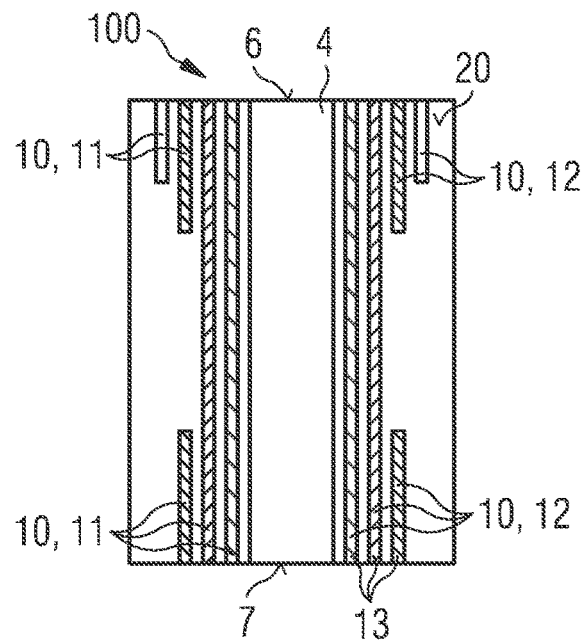
Figure 10D:
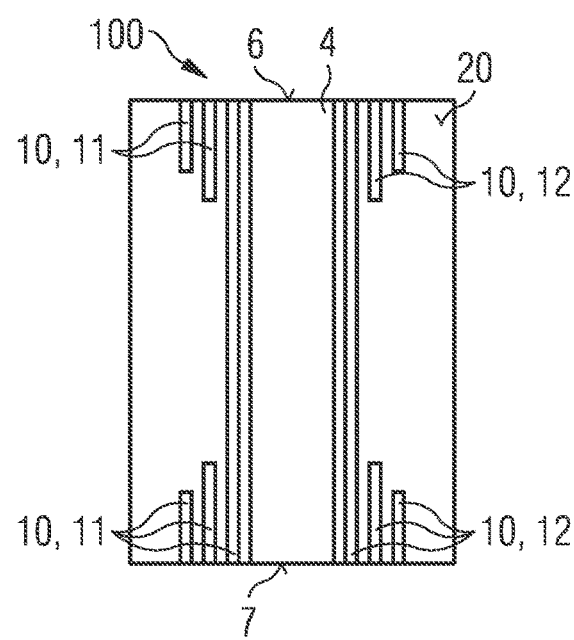
Figure 10E:
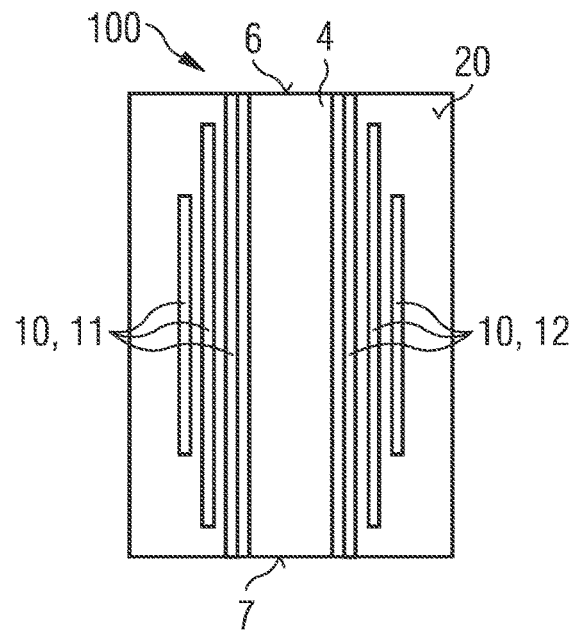
Figure 10F:
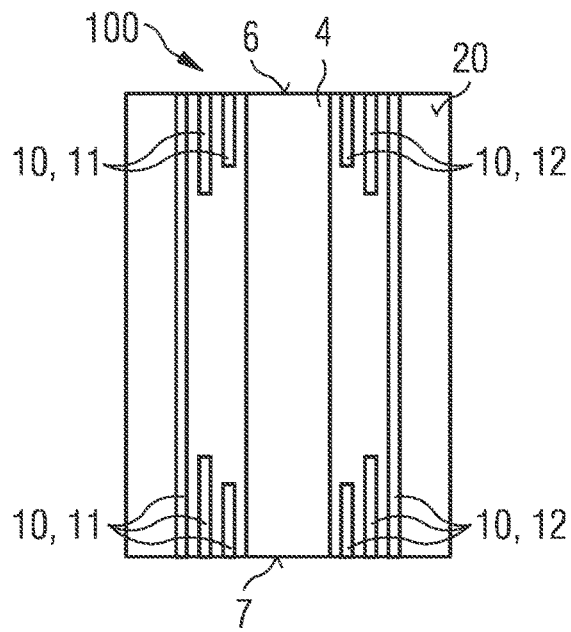
Figure 10G:
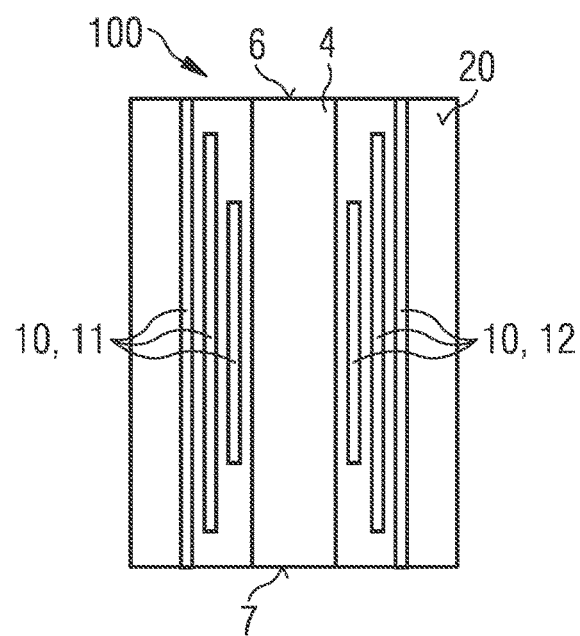

FIG. 10B shows a semiconductor laser diode 100 with a trench structure 10 whose trenches 11, 12 comprise different fillings and/or coatings having a solid material 13 as described, for example, in connection with FIGS. 8A to 8D. The semiconductor laser diode 100 according to the example in FIG. 10C also has such different filling and/or coating. Furthermore, the trenches 11, 12 have different lengths and thus a corresponding variation of the trench structure 10. FIG. 10D shows a similar example where trenches 11, 12 are filled with gas. The trenches 11, 12 comprise different lengths in the examples of the FIGS. 10C and 10D and, in FIG. 10C, additionally comprise in the outer region a laterally displaced course, wherein the outer trenches 11, 12 each begin at the light outcoupling surface 6 or the rear surface 7 and do not reach the opposite surface. As a result of this and, alternatively or in addition to this, due to a greater trench depth in the vicinity of the light outcoupling surface 6 and the rear surface 7, a stronger guidance of the light mode can be achieved in the region of the light outcoupling surface 6 and the rear surface 7, i.e. in the facet region, resulting in a wider far field that can offer an improved aspect ratio. This can be advantageous for projection applications, for example. On the other hand, the semiconductor laser diode 100 as shown in the example of FIG. 10E has trenches that become shorter as the distance to the active area increases and do not extend to the facets. As a result of this and, alternatively or in addition to this, due to a lower trench depth in the vicinity of the light outcoupling surface 6 and the rear surface 7, weaker guidance of the light mode can be achieved in the region of the light outcoupling surface 6 and the rear surface 7 that can result in a narrower far field, which can be advantageous for fiber coupling applications, for example. The examples shown in FIGS. 10F and 10G show reverse trench sequences compared to the examples of FIGS. 10D and 10E, wherein lighting properties corresponding to the examples of FIGS. 10D and 10E can be achieved.

Figure 10H:
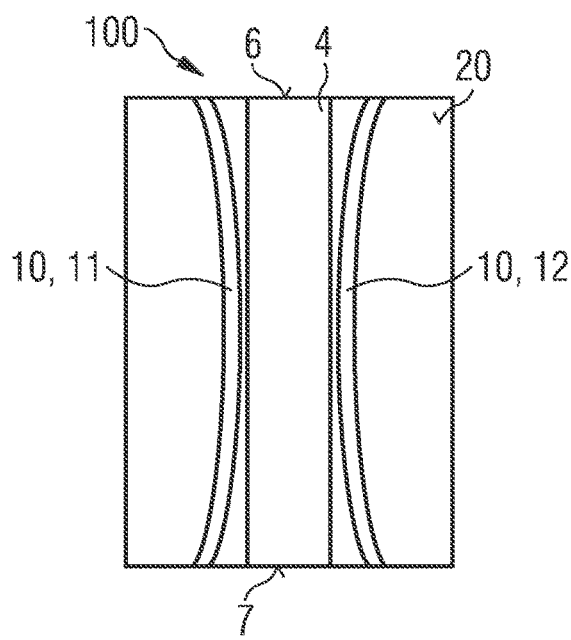
Figure 10I:
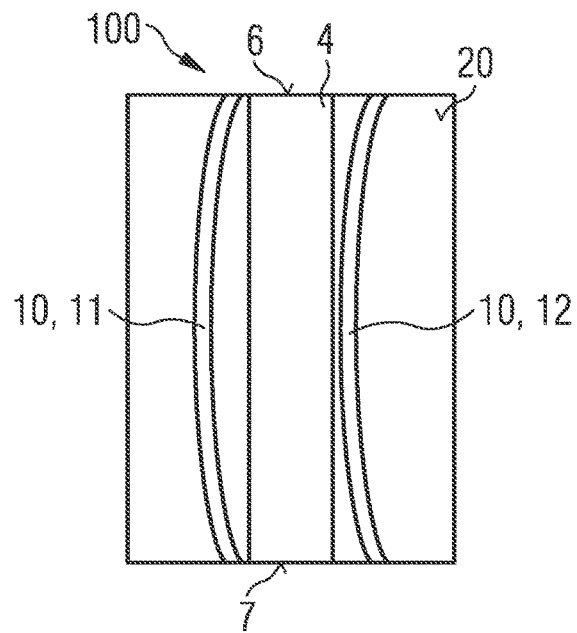

FIGS. 10H and 10I show examples of semiconductor laser diodes 100 with trench structures 10 and trenches 11, 12 with a directional variation in the form of curved courses. By such a curvature of the trenches 11, 12 a gradual refractive index change can be achieved by a simple photo technique in connection with the etching process for the production of the trenches 11, 12. Due to the mirror-symmetrical arrangement of the trenches 11, 12 shown in FIG. 10H and the increased distance between the trenches 11, 12 and the active area near the facets, a weaker guidance for a narrower far field can be achieved in the facet area by a gradually adjustable transition of the wave guidance. This may make it possible to minimize scattering losses. As shown in FIG. 10I, an asymmetric waveguide can be generated by the translation-symmetric arrangement of the trenches 11, 12 for a translation in a lateral direction. The asymmetry in the center and at the edge along the longitudinal direction can influence the number of modes in the active area that can be used, for example, to select modes or to avoid higher modes. As an alternative to the shown examples, each with one trench 11 and 12 next to the active area, there may also be several trenches 11 and several trenches 12. Furthermore, combinations with different depths, distances and/or lengths of curved trenches 11, 12 are also possible.

Figure 10J:
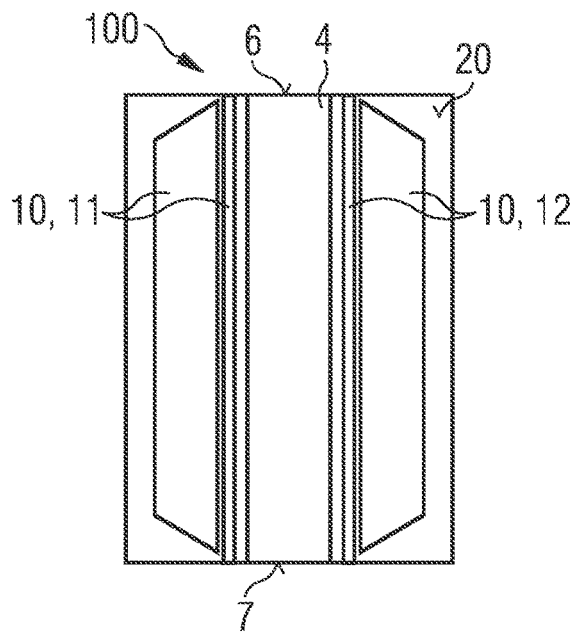
Figure 10K:
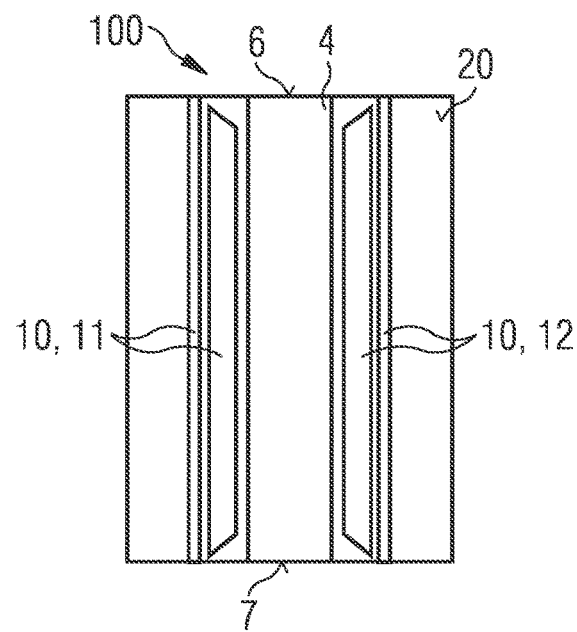
Figure 10L:
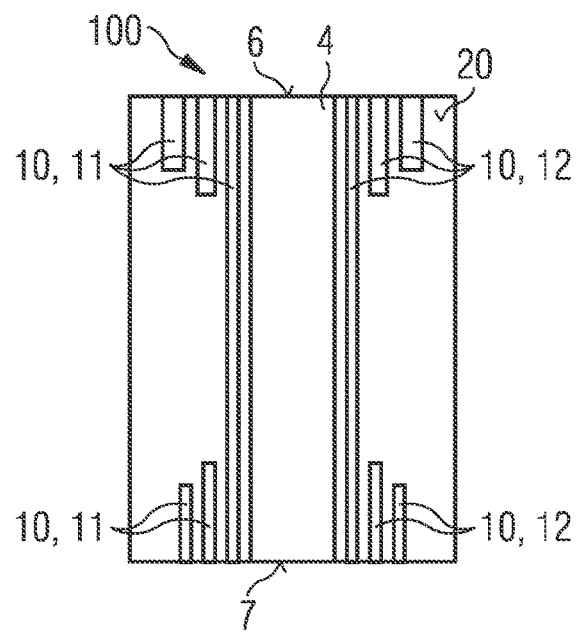
Figure 10M:
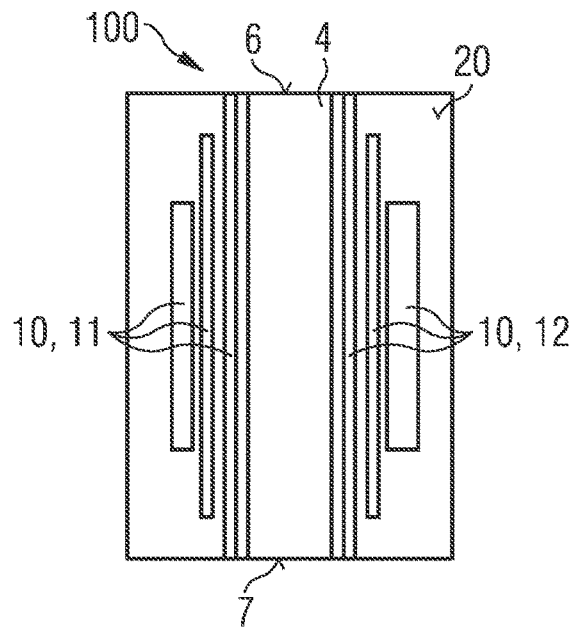
Figure 10N:
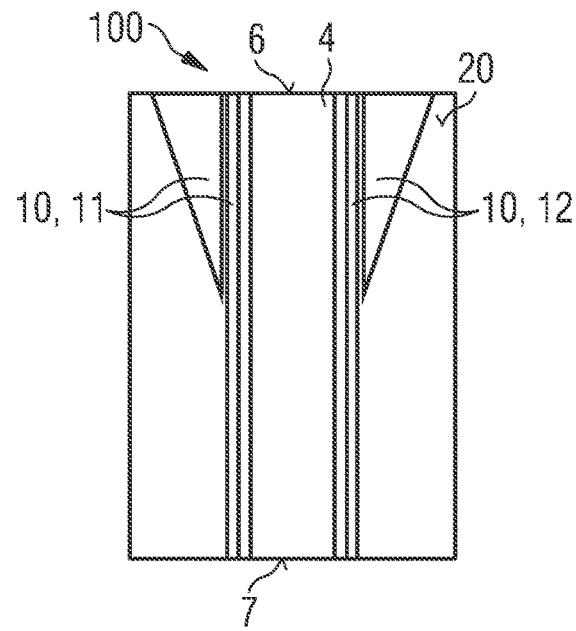

FIGS. 10J to 10N show examples of semiconductor laser diodes 100 with trench structures 10 and trenches 11, 12 with varying widths. As shown in FIGS. 10J, 10K and 10N, the width of the trenches 11, 12 can vary along their course in a longitudinal direction. By narrowing trenches towards the facets as shown in FIGS. 10J and 10K a weaker light guidance can be achieved as described above, while by widening the trenches 11, 12 at least towards the light outcoupling surface 6 as shown in FIG. 10N a stronger guidance can be achieved. Furthermore, as shown in FIGS. 10L and 10M, the widths of adjacent trenches 11, 12 can also be different, wherein the light guiding properties correspond in principle to those described in connection with FIGS. 10D and 10E and can be increased or decreased by the varying trench widths.

The varying trench lengths in the longitudinal direction shown in FIGS. 10A to 10N can be more than or equal to 5% or less than or equal to 100% of the length of the active area or the length of the ridge waveguide structure and thus typically the distance between the light outcoupling surface 6 and the rear surface 7. If the length of a trench is less than 100% of the distance between the facets, this means that the trench does not reach at least one of the facets, i.e. either the light outcoupling surface 6 or the rear surface 7 or both, and is at a distance therefrom.

FIGS. 11A to 11D show an example of method steps of a method of manufacturing a semiconductor laser diode 100 with a trench structure 10 that is purely an example of the trench structure described in connection with FIG. 3C. Alternatively, any other trench structure described above can also be produced using the method described below.

Figure 11A:
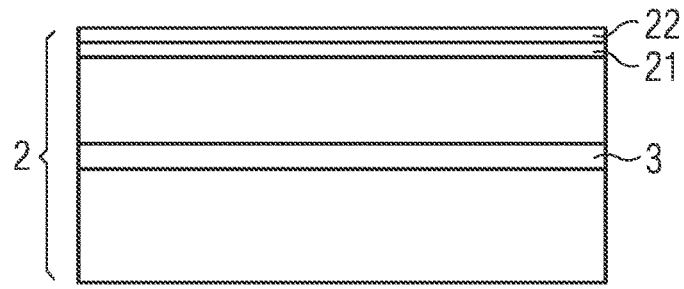
FIGS. 11A to 12D show schematic illustrations of method steps of manufacturing semiconductor laser diodes according to further examples.

In a first process step as shown in FIG. 11A, a semiconductor layer sequence 2 is provided. As described above, the semiconductor layer sequence can be grown on a growth substrate or transferred to a carrier substrate after growth before the further method steps. In addition to the active layer 3, the semiconductor layer sequence 2 comprises further semiconductor layers as described above, in particular p- and n-doped functional semiconductor layers such as cladding layers and/or waveguide layers. The semiconductor layer sequence 2 terminates with an electrically insulating or at least poorly electrically conducting semiconductor layer or semiconductor layer combination grown over a large area. In the shown example, semiconductor layers 21, 22, for example, are grown and thus epitaxially integrated, forming a blocking pn-junction. As an alternative or in addition, an undoped semiconductor layer or, especially in the nitride compound semiconductor material system, an AlInGaN layer with a high Al content can be grown.

Figure 11B:
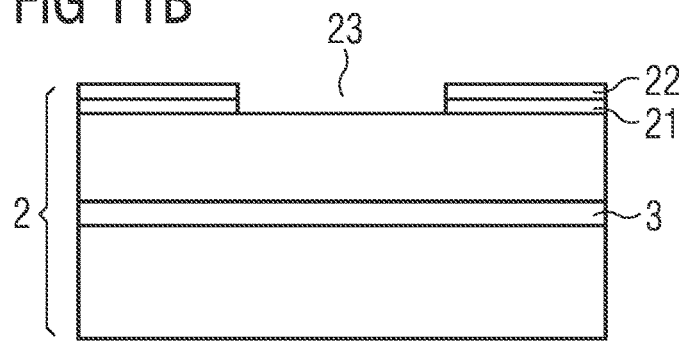
Figure 11C:
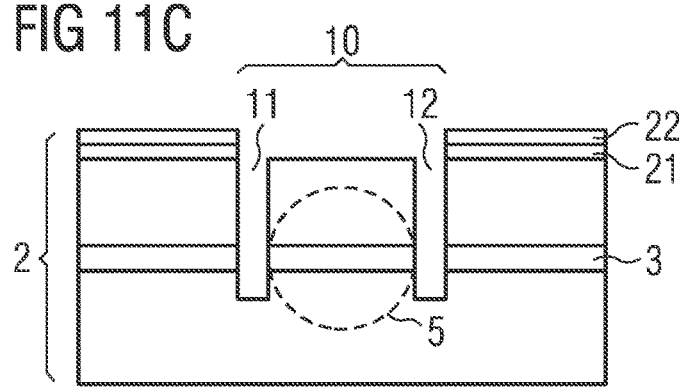
Figure 11D:
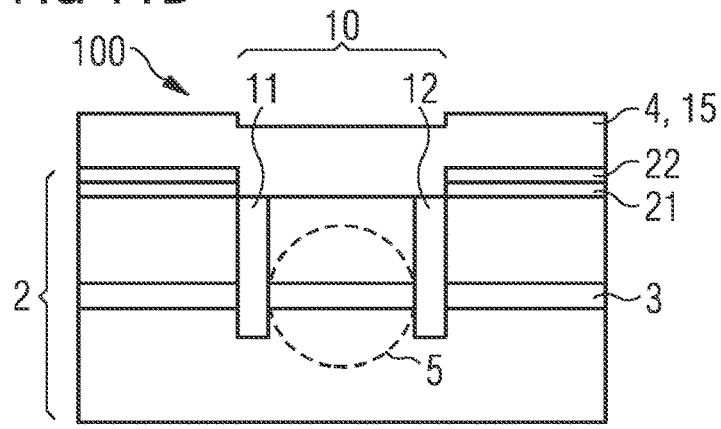
Figure 12A:
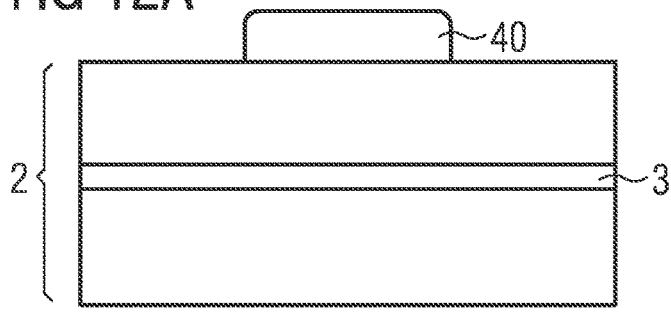
Figure 12B:
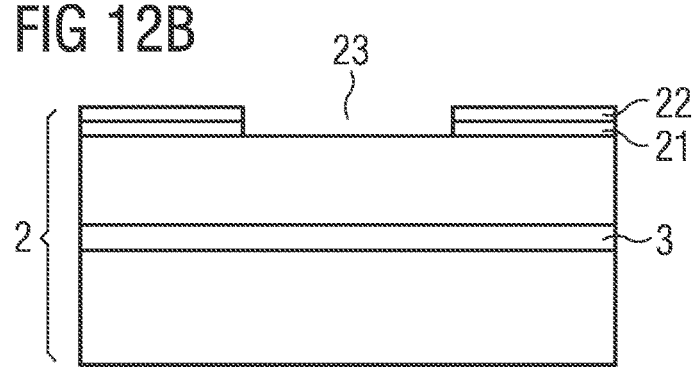
Figure 12C:
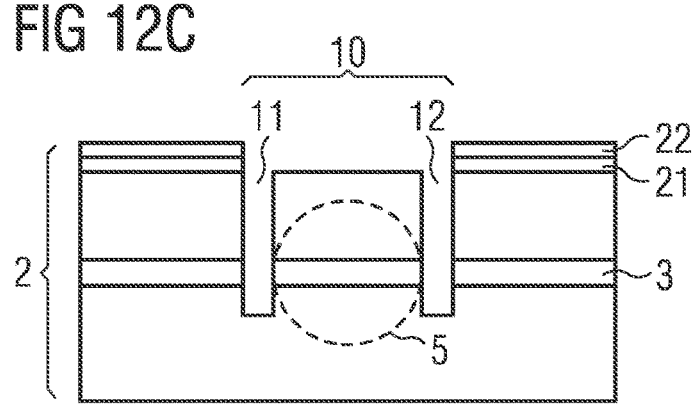
Figure 12D:
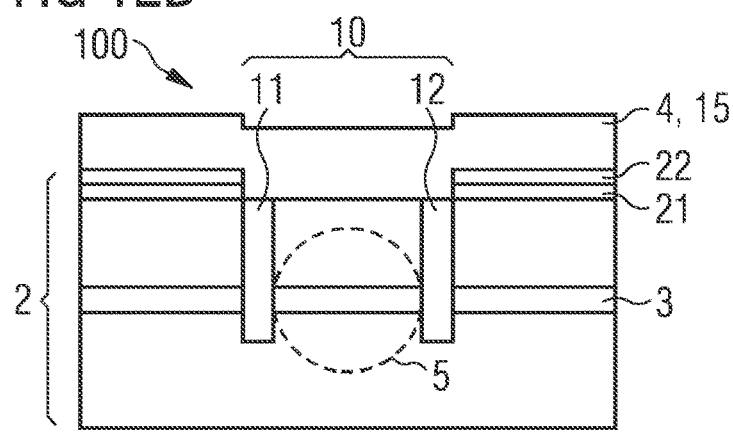

In a further method step as shown in FIG. 11B, the blocking pn-junction is etched away over the later active area. The trench structure 10 is then produced by etching the trenches 11, 12. The trenches 11, 12 can then be filled as described in some of the previous examples.

Subsequently, an electrode layer 4 is applied over a large area. Due to the blocking pn-junction next to the active area, only the part of the semiconductor layer sequence 2 corresponding to the active area 5 electrically conductively connects to the electrode layer 4. A suitably small trench width as described above can prevent the filling of the trenches 11, 12 with the material of the electrode layer 4 so that the electrode layer 4 simultaneously forms a covering material 15. Alternatively, the electrode layer 4 can also be applied only over the active area 5. Furthermore, it may also be possible to apply, alternatively or in addition to the blocking pn-junction, a covering material as described above to cover the trench structure 10.

FIGS. 12A to 12D show a modification of the method of the example of FIGS. 11A to 11D. After growth of the semiconductor layers of the semiconductor layer sequence 2 required for the light generation operation, a mask 40 is applied over the later active area 5, for example, with or made of $SiO_2$. The blocking pn-junction and/or another electrically insulating or at least poorly electrically conducting semiconductor layer or semiconductor layer combination is then grown. After removing the mask 40, the structure of the semiconductor layer sequence 2 corresponds to the structure described in FIG. 11B. The further method steps shown in FIGS. 12C and 12D correspond to the method steps described in connection with FIGS. 11C and 11D.

The examples shown in the figures and, in particular, the respective described features of the groove structure are not limited to the respective combinations shown in the figures. Rather, the shown examples as well as single features can be combined with one another, even if not all combinations are explicitly described. In addition, the examples described in connection with the figures may have alternative or additional features according to the description in the general part.

The possibilities described above for designing the region to the side of the center of the active area, for example, an area adjacent to a ridge waveguide structure with respect to the number, length, width, depth and filling of the trenches along and perpendicular to the course of the active area, allow laser parameters such as the far field, the power, the facet load limit, the threshold current and/or the efficiency to be set and controlled. Due to the achievable low refractive indexes in the trenches and the associated large refractive index jumps on the trench side walls, a strong guidance of the laser mode can be achieved, whose course perpendicular to and along the course direction of the active area can be adjusted by adjusting the refractive index courses.

Our methods and laser diodes are not limited by the description based on the examples. Rather, this disclosure includes each new feature and each combination of features, which includes in particular each combination of features in the appended claims, even if the feature or combination itself is not explicitly explained in the claims or examples.

This application claims priority of DE 10 2016 113 071.0, the subject matter of which is incorporated herein by reference.

The invention claimed is:

1. A semiconductor laser diode comprising a semiconductor layer sequence with an active layer having a main extension plane and that generates light in an active region and emits light via a light outcoupling surface during operation,
   wherein the active region extends from a rear surface opposite the light outcoupling surface to the light outcoupling surface along a longitudinal direction in the main extension plane,
   the semiconductor layer sequence comprises a trench structure comprising at least three laterally adjacent trenches on one side laterally next to the active region and a middle one of the at least three trenches has different distances from the two adjacent ones of the at least three trenches, and each trench of the trench structure extends in a longitudinal direction and projects from a top side of the semiconductor layer sequence in a vertical direction into the semiconductor layer sequence, and
   the trench structure varies in at least one of a lateral, vertical or longitudinal direction with respect to properties of the trenches.

2. The semiconductor laser diode according to claim 1, wherein a refractive index jump is produced on the surfaces that delimit the trenches in the lateral direction by which an expansion and a course of a light mode resulting in the active region are set.

3. The semiconductor laser diode according to claim 1, wherein the trench structure comprises at least one trench having one or more of variations:
   a varying width,
   a varying depth,
   a varying direction, and
   a varying cross section.

4. The semiconductor laser diode according to claim 1, wherein the trench structure comprises at least two trenches on a side laterally next to the active region, the at least two trenches having one or more of variations:
   a varying distance from each other,
   lengths different from each other,
   depths different from each other,
   widths different from each other;
   longitudinal positions different from each other,
   vertical positions different from each other,
   fillings different from each other,
   coatings different from each other, and
   cross sections different from each other.

5. The semiconductor laser diode according to claim 4, wherein the at least two trenches have a distance of 10 nm to 5000 nm.

6. The semiconductor laser diode according to claim 5, wherein the at least two trenches have a distance from each other substantially corresponding to half a wavelength of the light generated in the semiconductor layer sequence.

7. The semiconductor laser diode according to claim 1, wherein the trench structure has a number of trenches of less than or equal to 10 on a side laterally next to the active region.

8. The semiconductor laser diode according to claim 1, wherein the trench structure comprises at least one trench containing a gas.

9. The semiconductor laser diode according to claim 1, wherein the trench structure comprises at least one trench is at least partially filled with a solid material.

10. The semiconductor laser diode according to claim 9, wherein the solid material comprises at least one or more layers.

11. The semiconductor laser diode according to claim 9, wherein the solid material comprises a porous material.

12. The semiconductor laser diode according to claim 1, wherein the trench structure comprises at least one trench covered with a covering material so that the trench and the covering material form a cavity.

13. The semiconductor laser diode according to claim 1, wherein the semiconductor layer sequence comprises a ridge waveguide structure and the trench structure comprises at least one trench arranged in the ridge waveguide structure.

14. The semiconductor laser diode according to claim 1, wherein the trench structure comprises at least one trench having a width of less than or equal to 1000 nm.

15. The semiconductor laser diode according to claim 14, wherein the at least one trench has a width corresponding substantially to half a wavelength of the light generated in the semiconductor layer sequence.

16. The semiconductor laser diode according to claim 1, wherein the trench structure comprises at least one trench having a depth, measured from the top side of the semiconductor layer sequence, of 50 nm to 7000 nm.

17. The semiconductor laser diode according to claim 1, wherein the trench structure has on both sides laterally next to the active region the at least three laterally adjacent trenches, and is symmetrical to a plane of symmetry extending through the active region in vertical and longitudinal directions.

18. The semiconductor laser diode according to claim 1, wherein the trench structure comprises at least one trench and at least one further trench between which the active region is arranged in the lateral direction, and the at least one trench and the at least one further trench each have a varying direction and are translationally symmetrical with respect to a lateral direction.

19. A semiconductor laser diode comprising a semiconductor layer sequence with an active layer having a main extension plane and that generates light in an active region and emits light via a light outcoupling surface during operation, wherein the active region extends from a rear surface opposite the light outcoupling surface to the light outcoupling surface along a longitudinal direction in the main extension plane, the semiconductor layer sequence comprises a trench structure having at least two trenches on at least one side laterally next to the active region, and each trench of the trench structure extends in a longitudinal direction and projects from a top side of the semiconductor layer sequence in a vertical direction into the semiconductor layer sequence, the trench structure varies in at least one of a lateral, vertical or longitudinal direction with respect to properties of the at least two trenches, and the at least two trenches are arranged on a common side laterally next to at least one of the active region or at least one trench that is at least partially filled with a solid material comprising a porous material.

20. A semiconductor laser diode comprising a semiconductor layer sequence with an active layer having a main extension plane and that generates light in an active region and emits light via a light outcoupling surface during operation, wherein the active region extends from a rear surface opposite the light outcoupling surface to the light outcoupling surface along a longitudinal direction in the main extension plane, the semiconductor layer sequence comprises a trench structure having at least two trenches on at least one side laterally next to the active region, and each trench of the trench structure extends in a longitudinal direction and projects from a top side of the semiconductor layer sequence in a vertical direction into the semiconductor layer sequence and through the active layer, the trench structure varies in at least one of a lateral, vertical or longitudinal direction with respect to properties of the at least two trenches, and the trench structure comprises the at least two trenches on a side laterally next to at least one of the active region or at least one trench that is at least partially filled with a solid material comprising a porous material.

\* \* \* \* \*